(12) United States Patent
Veneruso et al.

(10) Patent No.: US 7,107,188 B2
(45) Date of Patent: Sep. 12, 2006

(54) DIGITAL PRESSURE DERIVATIVE METHOD AND PROGRAM STORAGE DEVICE

(75) Inventors: Anthony Veneruso, Missouri City, TX (US); Jeff Spath, Missouri City, TX (US)

(73) Assignee: Schlumberger Technology Corporation, Houston, TX (US)

( * ) Notice: Subject to any disclaimer, the term of this patent is extended or adjusted under 35 U.S.C. 154(b) by 90 days.

(21) Appl. No.: 10/411,579

(22) Filed: Apr. 10, 2003

(65) Prior Publication Data

US 2004/0133350 A1    Jul. 8, 2004

Related U.S. Application Data

(60) Provisional application No. 60/438,749, filed on Jan. 8, 2003.

(51) Int. Cl.
*G06F 15/00* (2006.01)
*G06F 17/40* (2006.01)

(52) U.S. Cl. ..................................................... 702/187
(58) Field of Classification Search .................. 702/17, 702/187, 195; 340/853–855.3; 367/82; 375/143
See application file for complete search history.

(56) References Cited

U.S. PATENT DOCUMENTS

| | | | | |
|---|---|---|---|---|
| 4,481,640 A | * | 11/1984 | Chow et al. ................. | 375/143 |
| 5,274,606 A | * | 12/1993 | Drumheller et al. ........... | 367/82 |
| 5,955,966 A | * | 9/1999 | Jeffryes et al. ........... | 340/853.1 |
| 5,969,638 A | * | 10/1999 | Chin ........................ | 340/855.3 |
| 6,097,310 A | * | 8/2000 | Harrell et al. ........... | 340/854.3 |
| 6,643,406 B1 | * | 11/2003 | Hajjahmad et al. ......... | 382/240 |
| 6,741,185 B1 | * | 5/2004 | Shi et al. .................. | 340/853.2 |
| 6,781,521 B1 | * | 8/2004 | Gardner et al. ........... | 340/854.4 |

* cited by examiner

*Primary Examiner*—Bryan Bui
*Assistant Examiner*—Aditya S. Bhat
(74) *Attorney, Agent, or Firm*—John J. Bouchard; Danita J. M. Maseles

(57) ABSTRACT

In a Digital Pressure Derivative Technique (DPDT) which uses convolution, an input signal including noise is convolved with a wavelet to produce an output signal which is a derivative of the input signal and which is substantially devoid of the noise. The DPDT can be used in many applications; however, in one such application, a pressure signal from a wellbore including noise is convolved with a special wavelet to produce an output signal which is the derivative of the input pressure signal, the output signal being substantially devoid of the noise. The wavelet is made from the unit sample response of a bandlimited, optimum linear phase Finite Impulse Response digital differentiator. The DPDT technique enables analysts to customize the differentiation based on the quality of the measured data without having to use traditional, subjective smoothing algorithms. The results presented here, in connection with the one such application mentioned above, bring significant improvements to the diagnosis and interpretation of pressure transient data, and interpretation techniques that utilize higher-order derivatives are now practical.

48 Claims, 21 Drawing Sheets

DIGITAL PRESSURE DERIVATIVE METHOD AND PROGRAM STORAGE DEVICE

CROSS REFERENCE TO RELATED APPLICATIONS

This is a Utility application of prior pending provisional application Ser. No. 60/438,749 filed Jan. 8, 2003 entitled "Digital Pressure Derivative Technique".

BACKGROUND OF THE INVENTION

The subject matter of the present invention relates to a Digital Pressure Derivative software, adapted to be stored in a computer system, for receiving a measurement function including 'noise', such as a measurement of pressure in an oil or gas well, for convolving the measurement function with a wavelet, and for generating a high resolution and high accuracy output signal which is substantially devoid of the 'noise' and which will enable a customer to interpret the high resolution and high accuracy output signal in order to obtain more information about the measurement. When the measurement function represents a measurement of pressure in an oil or gas reservoir, the pressure measurement function including the 'noise' is convolved with a derivative wavelet thereby generating a much higher resolution 'derivative of the pressure measurement function' which is substantially devoid of the 'noise', the absence of the 'noise' in the higher resolution 'derivative of the pressure measurement function' generated by the convolution enabling a customer to interpret the 'derivative of the pressure measurement function' and obtain more information about the pressure measurement and the reservoir.

Reservoir characterization using well test data has made remarkable progress in the last decade. Significant advances in mathematical techniques have permitted the analytical solution to complex reservoir flow problems which were previously obtainable only by means of numerical methods. Notable contributions in this area include the work of Ozkan and Raghavan[1-3] in which the Laplace transform and the method of sources and sinks were systematically combined to compute pressure distributions for various well and reservoir complexities. Utilizing the Laplace transform allows the addition of natural fractures,[4] variable rate production[5] (wellbore storage) and commingled production[6] in a general and efficient manner. Combined with the Stehfest[7] algorithm for numerically inverting the Laplace space solutions into the time domain we have, from a software implementation standpoint, a straightforward approach to developing efficient and extendible libraries of analytical solutions to the diffusivity equation. For situations in which analytical procedures are limited (e.g., complex geometries, multiphase flow) we may use recently developed software specifically designed to interactively model transient welltest data using finite-difference methods (e.g., GeoQuest's WellTest 200).

The advances made in the measurement of pressure transient data have complimented these new solution techniques by providing the stability and resolution required to perceive complexities of the well/reservoir system which may otherwise have gone unnoticed. Currently, we are able to measure pressures with a resolution of 0.001 psi with 10 second sampling and with a stability (drift) of less than three psi/year.[8]

The interpretation and measurement of well test data have, with a few recent exceptions, advanced separately. Notable exceptions include two studies presented by Veneruso et al.[9,10] The first demonstrates how errors in pressure measurement affect well test analysis using a transfer function approach. Gauge effects, such as drift and resolution are incorporated into the analytical simulation of well tests in order to optimize testing performance with cost-effective instruments. The second discusses key data acquisition and data transmission techniques in addition to giving a good overview of the electronic processes involved in making pressure, flowrate and temperature measurements.

In this specification, we hope to further reduce the separation between advances in well test interpretation and advances in measurement technology by incorporating our knowledge of one within the other. Specifically, we utilize the firm mathematical foundation of Digital Signal Processing to combine the characteristics of the well test measurement process with our knowledge of reservoir physics to improve the pressure derivative technique of diagnosing and interpreting pressure transient data. The term derivative as used herein is intended to imply differentiation with respect to the time function plotted on the abscissa of the appropriate semi-log plot; for generality, this should be considered the superposition time function.

Arguably the most significant advance in well test interpretation the last decade, the pressure derivative, as described by Bourdet et al.,[11-14] has become the primary tool for diagnosing well and reservoir behavior. It provides the basis for modern well test interpretation methodology[15] and has become a customary and requisite feature in the myriad commercial well test interpretation software now available. In many situations however, the derivative of the measured data is uninterpretable or, worse, mis-interpreted by the analyst because of various artifacts of the measuring and differentiating process collectively termed "noise". A published article[16] states "The main disadvantage of the pressure derivative is that one must construct derivative data by numerical differentiation of measured pressure data. The resulting pressure derivative data often are noisy and difficult to interpret. While various "smoothing" techniques have been used to reduce noise, some concern exists that the smoothing procedures may alter the basic character of the data." This opinion is respected by most engineers involved with the interpretation of well test data.

Various algorithms have been used in an effort to eliminate or reduce the inevitable noise associated with the numerical differentiation of measured data. For example, Bourdet, et al.[14] considers polynomial fitting of the data and taking the analytical derivative of the polynomial. This procedure, in addition to being cumbersome, alters the shape of the original data. A second procedure given is to compute the third derivative of the data and subsequently integrating twice. This method tends to give false oscillations at late times and during infinite acting radial flow. The current practice is to use centuries-old techniques developed by Newton and Stirling for interpolating data tables (backward, forward, or central difference typically utilizing three points). When viewed in the frequency domain, these techniques are clearly highpass and bandpass filters, which exaggerate high frequency noise and distort the "true" dp/dt curve. The data is then typically smoothed by choosing the points used in the calculation a sufficient distance from the point of interest. This distance, given as L in Ref. 14, is expressed in terms of the appropriate time function. The idea of smoothing the derivative is considered suspect by some due to the subjective choosing of L. If L is chosen too large, the character of the actual signal will be distorted. Nevertheless, judging by the standard use of this method in commercial well testing software, it apparently has become the most popular. Akima[17] suggests a slightly different approach whereby the slope of the point in question and two points on each side are used. A third degree polynomial representing a portion of the curve between a pair of given points is determined by the coordinates and the slopes at the two points. The derivative of the polynomial is then computed.

Regardless of which method of numerical differentiation is used and regardless of the chicanery employed to reduce the scatter in the resulting derivative data, the analyst is often left with data not entirely representative of the well/reservoir system (s)he is trying to identify.

In this specification, we describe a new technique for differentiating well test pressure data called the Digital Pressure Derivative Technique (DPDT). The DPDT produces the most accurate and representative dp/dt curve by incorporating knowledge of both reservoir and gauge physics. It is efficient and straightforward to implement and may be used on either real-time or recorded data. No modifications to gauges or surface hardware are necessary. Furthermore, error bounds and a quality control mechanism, indicating the end of a transient (i.e. a signal-to-noise ratio test) can be provided allowing the optimal use of recorder memory space. Additional DSP techniques such as oversampling may be utilized to further enhance the quality of the DPDT. The DPDT is generated by convolving the measured pressure samples with a special wavelet. This wavelet is made from the unit sample response of a band-limited, optimum linear phase finite impulse response (FIR) differentiator. The DPDT is based on the firm mathematical foundation of Digital Signal Processing (DSP), reservoir physics and the characteristics of the pressure measurement system.

SUMMARY OF THE INVENTION

The present invention addresses the above-mentioned limitations, involved in the interpretation of a signal, which includes noise, obtained from a measurement, by convolving that signal with a wavelet thereby generating an output signal, which is substantially devoid of the noise.

Thus, an aspect of the present invention involves a method, responsive to an input signal with noise representing a measurement, for generating an output signal representing the measurement substantially devoid of the noise, the method including convolving the input signal with a wavelet; and generating the output signal in response to the convolving step, the output signal being substantially devoid of the noise.

Another aspect of the invention is a program storage device readable by a machine, tangibly embodying a program of instructions executable by the machine, to perform method steps for generating an output signal representing a measurement which is substantially devoid of any noise in response to an input signal representing the measurement which includes the noise, the method steps including convolving the input signal with a wavelet, and generating the output signal in response to the convolving step, the output signal being substantially devoid of the noise.

Another aspect of the present invention involves a method responsive to an input signal with noise representing a measurement for generating an output signal representing the measurement substantially devoid of the noise, the method comprising: convolving the input signal including the noise with a wavelet; and generating the output signal in response to the convolving step, the output signal representing a derivative of the input signal, the output signal being substantially devoid of the noise.

Another aspect of the present invention involves a program storage device readable by a machine, tangibly embodying a program of instructions executable by the machine, to perform method steps which are responsive to an input signal with noise representing a measurement for generating an output signal representing the measurement substantially devoid of the noise, the method steps comprising: convolving the input signal including the noise with a wavelet; and generating the output signal in response to the convolving step, the output signal representing a derivative of the input signal, the output signal being substantially devoid of the noise.

Further scope of applicability of the present invention will become apparent from the detailed description presented hereinafter. It should be understood, however, that the detailed description and the specific examples, while representing a preferred embodiment of the present invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein:

FIGS. 5 through 40 are utilized in the 'Detailed Description of the Preferred Embodiment', wherein, FIG. 5 illustrates a schematic of a pressure gauge transfer function, FIG. 6 represents an illustration of Aliasing, FIG. 7 illustrates the frequency response of an Ideal Differentiator, FIG. 8 illustrates a comparison of Newton and Ideal Derivatives, FIG. 9 illustrates sampling for conventional differentiators, FIG. 10 illustrates a comparison of Stirling and Ideal Derivatives, FIG. 11 illustrates a coefficient wavelet from the Remez Exchange Algorithm, FIG. 12 illustrates a frequency response of the coefficient wavelet, FIG. 13 illustrates a power spectral density computed for typical reservoir models, FIG. 14 illustrates an input signal and a finite difference derivative, FIG. 15 illustrates a comparison of the signal and signal+noise spectrums, FIG. 16 illustrates a comparison of a finite difference derivative with DPDT, FIG. 17 illustrates pressure data with logarithmic sampling, FIG. 18 illustrates equally and logarithmically spaced Remez Coefficients, FIG. 19 illustrates the pressure slope for common flow regimes, FIG. 20 illustrates curves of 20 log (delta) vs frequency for N=4,8,16,32, and 64, FIG. 21 illustrates curves of 20 log (delta) vs frequency for N=5,9,17,33, and 65, FIG. 22 illustrates coefficient wavelets for three different filter lengths, FIG. 23 illustrates a frequency response for three coefficient wavelets, FIG. 24 illustrates DPDT responses for three different filter lengths, FIG. 25 illustrates the determination of $f_c$ for a unit signal to noise ratio, FIG. 26 illustrates the DPDT for $f_c$=0.10, FIG. 27 illustrates the DPDT for $f_c$=0.05, FIG. 28 illustrates the DPDT for $f_c$=0.025, FIG. 29 is a comparison of the DPDT with the analytical and finite difference derivative, FIG. 30 illustrates a log-log plot of delta pressure and derivative for example 1, FIG. 31 illustrates a semi-log plot of delta pressure and derivative for example 1, FIG. 32 illustrates a power spectral density for example 1, FIG. 33 illustrates a DPDT for example 1, FIG. 34 illustrates a log-log plot of delta pressure and derivative for example 2, FIG. 35 illustrates a semi-log plot of delta pressure and derivative for example 2, FIG. 36 illustrates a power spectral density for example 2, FIG. 37 illustrates the DPDT For example 2, FIG. 38 illustrates a comparison of the DPDT with a conventional derivative, L=0.09, FIG. 39 illustrates a comparison of various smoothing values, L, and FIG. 40 illustrates an input window for DPDT parameters.

DESCRIPTION OF THE PREFERRED EMBODIMENT

Figure 1:
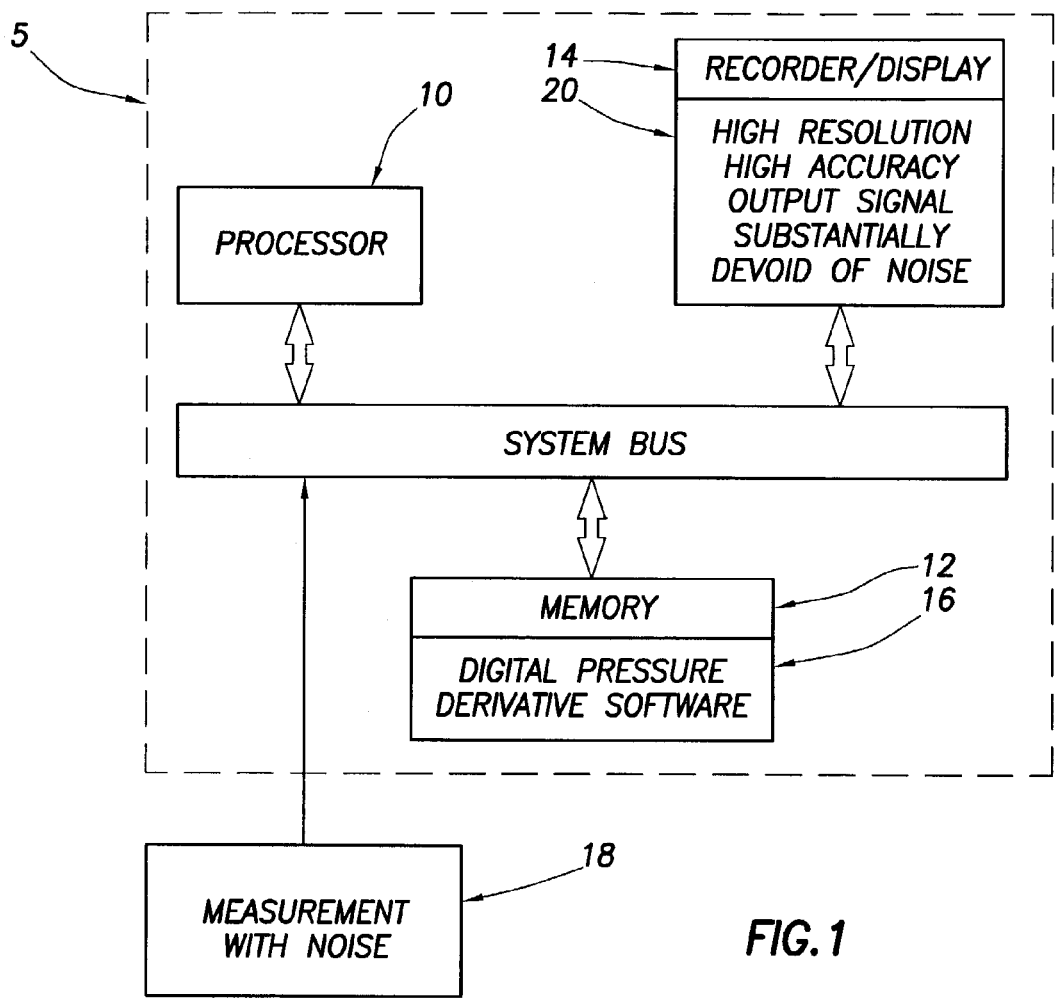
FIG. 1 illustrates a computer system which stores a 'Digital Pressure Derivative software' for performing the 'Digital Pressure Derivative Technique (DPDT) in accordance with one aspect of the present invention.

Referring to FIG. 1, a computer system 5, or workstation or personal computer, is illustrated. The computer system 5 includes a processor 10 connected to a system bus, a memory 12 connected to the system bus, and a recorder or display device 14 connected to the system bus. The memory 12 is a program storage device or computer readable medium which stores a software program therein entitled the 'Digital Pressure Derivative software' 16. The Digital Pressure Derivative software 16 was loaded into the memory 12 of the computer system of FIG. 1 from another separate program storage device, such as a CD-Rom, which also stored the software 16 therein. The computer system 5 of FIG. 1 receives input data representing a 'measurement with noise' 18. The measurement data 18 includes 'noise', the 'noise' rendering the measurement data 18 substantially un-interpretable by a customer. When the processor 10 executes the Digital Pressure Derivative software 16 stored in the memory 12, the recorder or display device 14 will display a 'high resolution high accuracy output signal substantially devoid of the noise' 20. Since the 'noise' is now absent, the 'output signal substantially devoid of the noise' 20 is interpretable by the customer. This significance of this 'output signal substantially devoid of the noise' 20 will be discussed hereinbelow. The computer system 5 of FIG. 1 may be a personal computer (PC), a workstation, or a mainframe. Examples of possible workstations include a Silicon Graphics Indigo 2 workstation or a Sun SPARC workstation or a Sun ULTRA workstation or a Sun BLADE workstation. The memory 12 is a computer readable medium or a program storage device, which is readable by a machine, such as the processor 10. The processor 10 may be, for example, a microprocessor, microcontroller, or a mainframe or workstation processor. The memory 12, which stores the Digital Pressure Derivative software 16, may be, for example, a hard disk, ROM, CD-ROM, DRAM, or other RAM, flash memory, magnetic storage, optical storage, registers, or other volatile and/or non-volatile memory.

Figure 2:
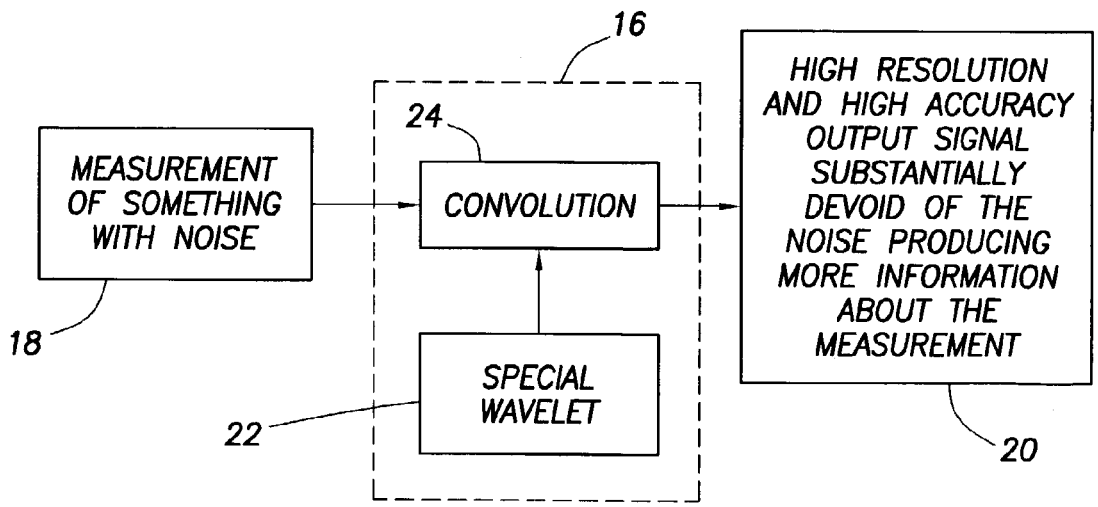
FIGS. 2 and 3 illustrate a convolution of a measurement function including noise with a wavelet to thereby generate a high resolution and high accuracy output signal without the noise and produce more information about the measurement, the high resolution and high accuracy output signal representing a first order derivative of the measurement function when the measurement is one of pressure in an oil or gas reservoir.

Referring to FIG. 2, a 'measurement of something with noise' 18 provides data relating to some kind of measurement. The 'measurement with noise' 18 represents a first function. A special wavelet 22 represents a second function. The special wavelet 22 in this specification will be discussed hereinbelow. The first function representing the measurement with noise 18 is convolved, in a convolution 24, with the second function representing the special wavelet 22. The convolution 24, discussed in section 2.5 of this specification, is accomplished by equations 16 or 17 presented hereinbelow. As a result of the convolution 24, a 'high resolution and high accuracy output signal substantially devoid of the noise' 20 is generated which will produce more information about the measurement 18 due to the absence of the noise. Although the measurement data 18 included noise which rendered the data un-interpretable by a customer, the 'high resolution and high accuracy output signal' 20 of FIG. 2 is 'substantially devoid of the noise' and, as a result, the 'output signal' 20 in FIG. 2 is interpretable by the customer. This will be discussed in greater detail later in this specification.

Figure 3:
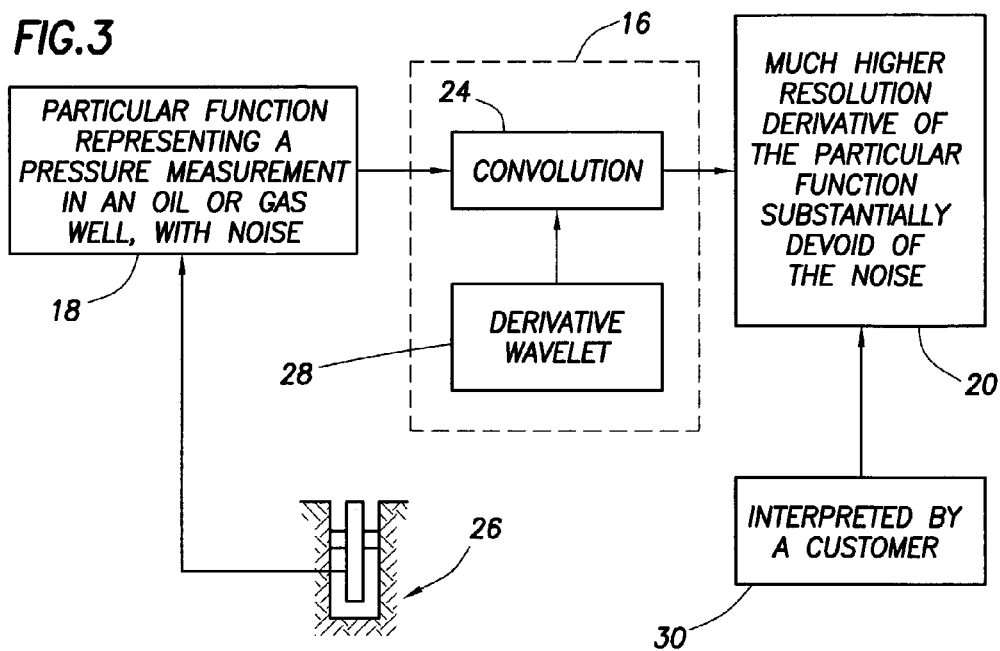

Referring to FIG. 3, the pressure in a wellbore 26 can be measured. When the pressure in the wellbore 26 is measured, a 'particular function representing a pressure measurement in an oil or gas well, with noise' 18 is generated. However, due to the presence of the noise, the 'particular function' 18 is un-interpretable by a customer. However, the 'particular function representing a pressure measurement in an oil or gas well, with noise' 18 is convolved, in a convolution 24, with a derivative wavelet 28 (to be described later in this specification).

The derivative wavelet 28 is made from the unit sample response of a bandlimited, optimum linear phase Finite Impulse Response digital differentiator. That is, the derivative wavelet 28 is designed using a band limited transform of the ideal differentiator (i.e., $\cos(\pi n)/n$) as described in Section 2.8. The coefficients of the wavelet are computed using a Chebyshev method using the Remez exchange algorithm. The primary inputs to the algorithm are the filter length, N, and the cutoff frequency, $f_c$, that is the frequency, above which, noise is the principal component of the total signal. For illustration purposes, we arbitrarily choose a filter length of 60 although, as we will see later in the discussion, N may be computed using empirical formulas.

In FIG. 3, recall that the convolution 24 is represented by equations 16 and 17 hereinbelow. As a result of the convolution 24, a 'much higher resolution derivative of the particular function substantially devoid of the noise' 20 is generated. Since the 'derivative of the particular function' 20 is substantially devoid of the noise, the 'derivative of the particular function' 20 in FIG. 3, generated by the convolution 24, can be interpreted by a customer, as noted in step 30 of FIG. 3.

Figure 4:
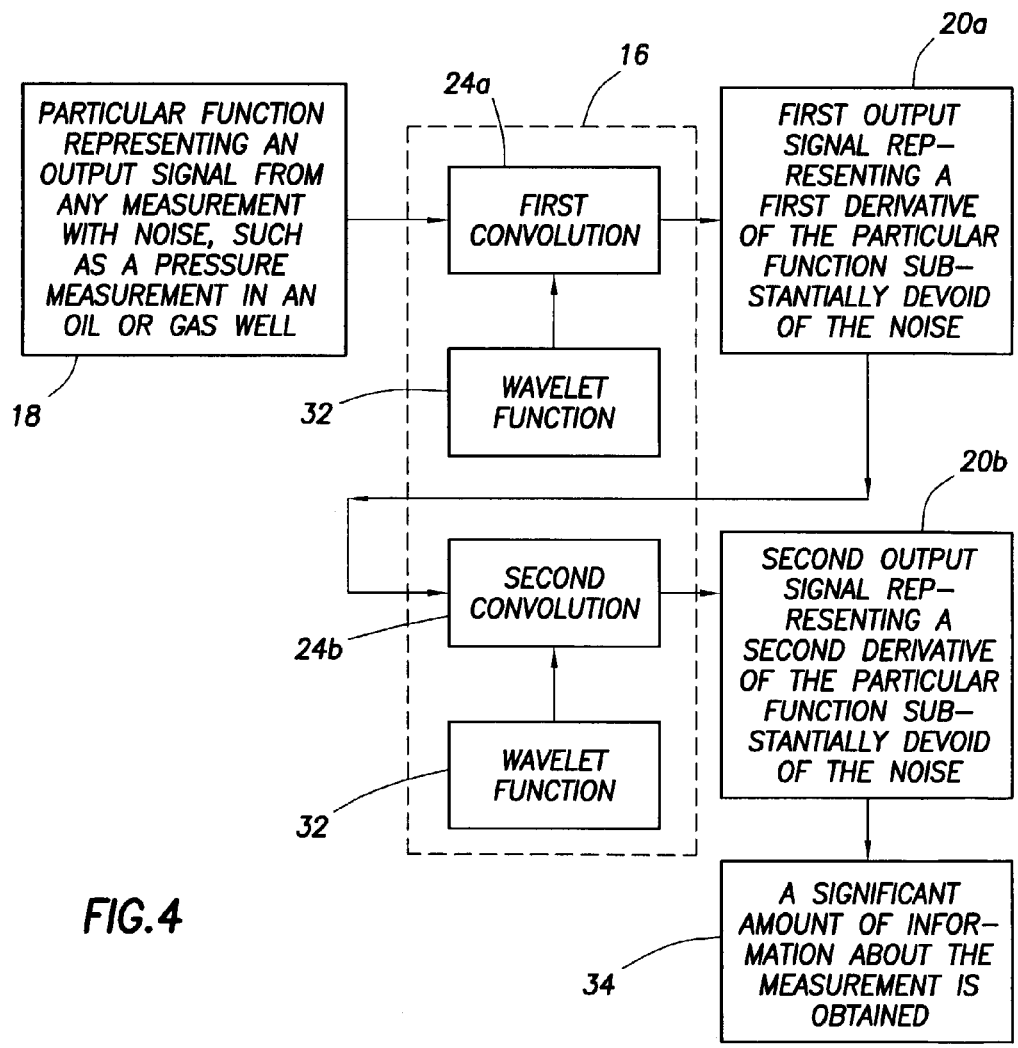
FIG. 4 illustrates two of the convolutions of FIGS. 2 and 3 for generating a second order derivative of the particular function being measured, a significant amount of information being determined from the second order derivative of the particular function due to the absence of any overwhelming noise.

Referring to FIG. 4, consider any measurement having noise, such as a pressure measurement with noise in an oil or gas reservoir. Due to the presence of the noise, such a measurement is un-interpretable by a customer. In FIG. 4, a 'particular function representing an output signal from any measurement with noise, such as a pressure measurement in an oil or gas well' 18 is convolved, in a first convolution 24a, with a wavelet function 32. When the 'particular function' 18 is convolved, in the first convolution 24a, with the wavelet function 32, a 'first output signal representing a first derivative of the particular function substantially devoid of the noise' 20a is generated. However, the 'first output function' 20a undergoes a second convolution with the wavelet function 32 in a 'second convolution' 24b. As a result, a 'second output signal representing a second derivative of the particular function substantially devoid of the noise' 20b is generated. Since the 'second output signal' 20b is substantially devoid of any 'noise', as noted in step 34, a significant amount of information about the measurement is obtained.

A more detailed description of the operations represented in FIGS. 1, 2, 3, and 4 will be set forth hereinbelow.

A significant amount of time and money has been spent on research and development of high resolution pressure gauges including measuring the pressure (for example, in an oil or gas well in a reservoir) and generating 'high resolution and high accuracy electronic output signals' representing the pressure, the output signals having an accuracy or resolution to the second and third decimal place. Those 'high resolution and high accuracy electronic output signals' are depicted as the 'measurement 18' in FIGS. 1, 2, 3, and 4. When it came time to use the measured pressure to make interpretations and make suggestions about how to improve the customer's well and how his reservoir performs, the information pertaining to the measured pressure was literally discarded, that is, the 'high resolution and high accuracy output signals having a resolution to the second and third decimal place' 18 of FIGS. 1–4 were literally discarded because of the 'noise on the output pressure signal'. That is, on the one hand, money was being spent on the development of high resolution and high accuracy gauges, and, on the other hand, on the interpretation side, the 'high resolution and high accuracy output signals having a resolution to the second and third decimal place' 18 that were obtained from the high resolution and high accuracy gauges were not being utilized because of the 'noise on the output pressure signal'.

In this specification, two technologies have been combined together: (1) the development of high resolution and high accuracy pressure gauges adapted for use in a wellbore including signal processing of output signals from the gauges, and (2) reservoir engineering and practical application of the data obtained from those gauges. Thus, the physics of the gauges has been combined with the physics of the reservoir. As a result, an 'algorithm' in accordance with the present invention, hereinafter called the 'Digital Pressure Derivative software' 16, has been developed wherein, rather than throw away and discard the 'high resolution and high accuracy output signals having the resolution to the second and third decimal place' 18 of FIGS. 1–4 including the 'noise on the output pressure signal', such output signals 18 are being utilized to further an understanding of the reservoir. The Digital Pressure Derivative software 16 of the present invention will not discard the 'high resolution and high accuracy output pressure signals having an accuracy or resolution to the second and third decimal place' 18 generated by the pressure gauges merely because of the 'noise on the output pressure signal'. Instead, the Digital Pressure Derivative software 16 of the present invention will utilize the 'noise on the output pressure signal' associated with the 'high resolution and high accuracy output pressure signals' 18 of FIGS. 1–4 to further an understanding of the reservoir since a significant amount of information can be gained from that 'noise'.

While the Digital Pressure Derivative software 16 of the present invention does utilize mathematical signal processing techniques to analyze the pressure signal being output from the gauges, the Digital Pressure Derivative software 16 of the present invention includes a 'special method' for analyzing the 'noise on the output pressure signal', associated with the 'high resolution and high accuracy output pressure signals having an accuracy or resolution to the second and third decimal place' 18 of FIGS. 1–4, in order to obtain more accurate information from the reservoir.

Figure 37:
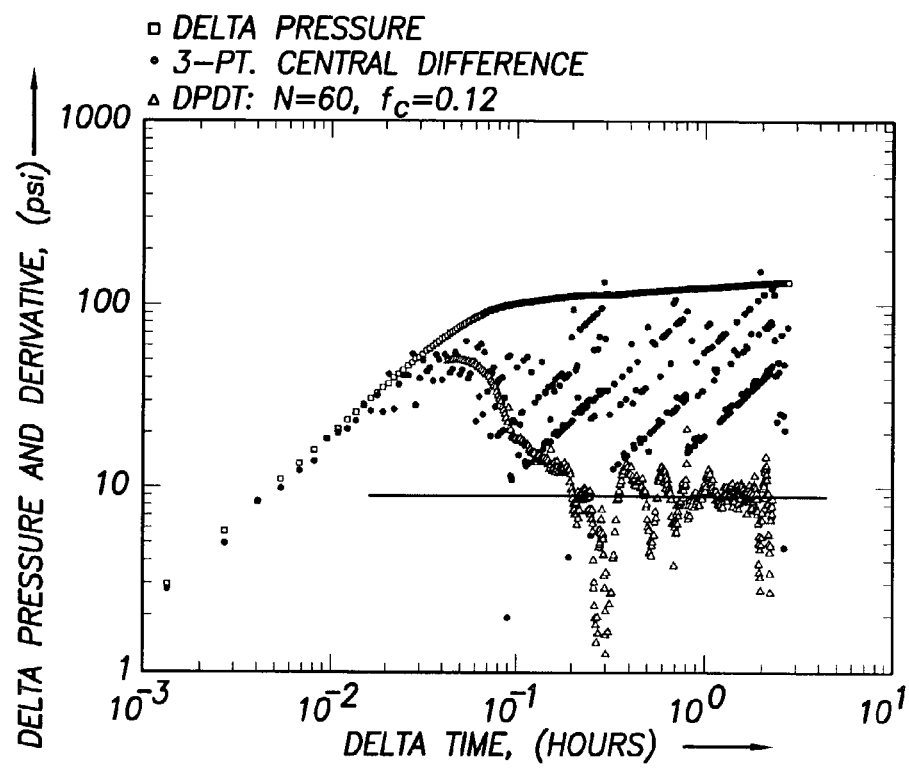
Figure 38:
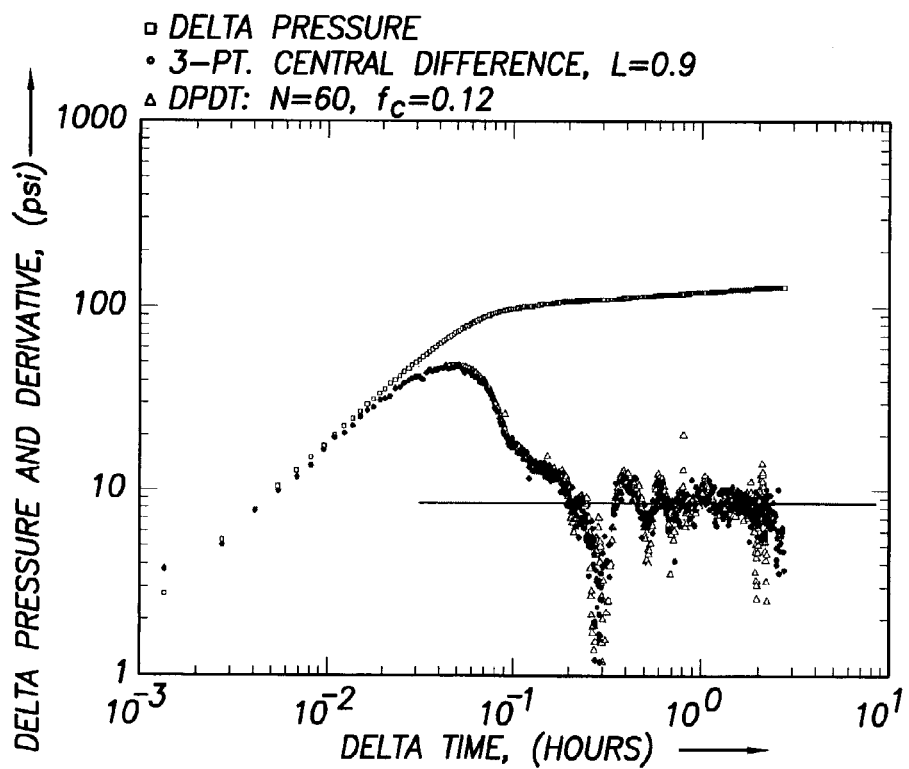

In FIGS. 1–4, 37, and 38, the 'high resolution and high accuracy pressure signals' 18 being generated by the pressure gauges include a lot of scattered data (i.e., the 'noise') and, as a result, the signals 18 were previously un-interpretable because of the aforementioned 'noise on the output pressure signal'. However, the Digital Pressure Derivative software 16 of the present invention will receive the 'high resolution and high accuracy but previously uninterpretable pressure signals including the noise having an accuracy or resolution to the second and third decimal place' 18 generated by the pressure gauges, an example of which is shown in FIG. 37, and, responsive thereto, the Digital Pressure Derivative software 16 of the present invention will implement the aforementioned 'special method' thereby generating the 'interpretable high resolution and high accuracy output pressure signals' 20, 20a, 20b of FIGS. 1–4, an example of which is shown in FIG. 38. The 'interpretable high resolution and high accuracy output pressure signals' 20, 20a, 20b generated by the Digital Pressure Derivative software 16 of the present invention are 'interpretable' because of a flattening in the curve shown in FIG. 38. The flattening in the curve shown in FIG. 38 indicates that the 'high resolution and high accuracy output signal' 20, 20a, and 20b of FIGS. 2–4 is 'substantially devoid of the noise', which renders the signal 20, 20a, and 20b 'interpretable', thereby allowing a customer to obtain more substantive information from the measurement. Note that the 'pressure signals' generated by the gauges shown in FIG. 37 do not exhibit any such flattening in the curve, which indicates the existence of the 'noise' in connection with the 'pressure signals' thereby rendering the 'pressure signals' of FIG. 37 'un-interpretable' by a customer.

The aforementioned 'special method' practiced by the Digital Pressure Derivative software 16 of the present invention involves the computation of a 'pressure derivative'. The computation of the 'pressure derivative' includes the following steps.

Figure 11:
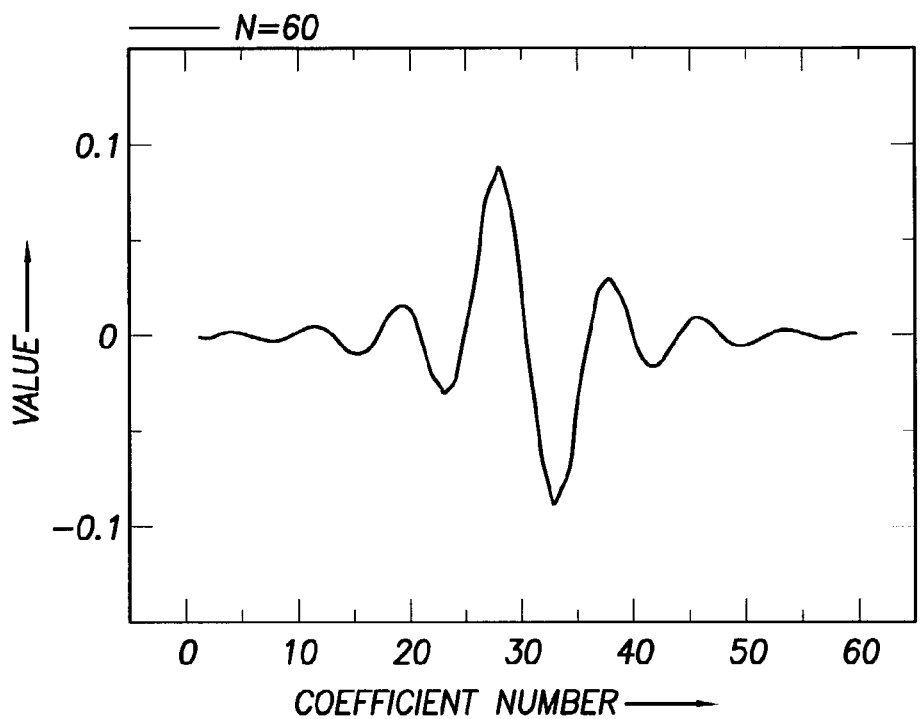

In FIGS. 1–4, and 11, the first step of the 'special method' is a signal processing step. This step includes the design of a special 'wavelet function' 22, 28, and 32 of FIGS. 1–4. The 'wavelet function' 22, 28 and 32 is designed in response to our knowledge of the reservoir, such as the minimum and maximum permeability of the reservoir, the minimum and maximum length of the well test of the reservoir, and other 'general guidelines' pertaining to the reservoir. When those 'general guidelines' pertaining to characteristics of the reservoir are known, the 'wavelet function' 22, 28 and 32 is computed. An example of a typical 'wavelet' is shown in FIG. 11. The data which is used for designing the 'wavelet function' 22, 28 and 32 is disclosed in a table in this specification, the table being entitled "Finite Impulse Response (FIR) Linear Phase Digital Filter Design, Remez Exchange Algorithm, Differentiator Filter Length=60, Impulse Response". The 'wavelet function' 22, 28 and 32 is a simple function since it is approximately sinusoidal in nature.

The second step of the 'special method' is a convolution step 24, 24a, and 24b. The convolution equation is disclosed in this specification as equation (16) in the time domain, and as equation (17) in Laplace space. The convolution 24 of two time domain functions in Laplace space is very simple and is preferred because such convolution involves a simple multiplication of the two time domain functions. The 'wavelet function' 22, 28, 32 is convolved (in a convolution step 24, 24a, and 24b) with 'that which we are measuring' 18 (including any accompanying noise) using either equation (16) or equation (17). If 'that which we are measuring' 18 is the 'pressure response of a reservoir', then, the convolution step 24, 24a, 24b of the 'special method' includes the step of convolving the aforementioned 'wavelet function' 22, 28, 32 with a 'second function representing the pressure response of the reservoir including any accompanying noise' 18 thereby generating an output signal 20 of FIG. 3 which is substantially devoid of the accompanying noise and which represents a function that is the 'derivative of the second function 18 representing the pressure response of the reservoir'.

For example, in a flowing oil or gas well, a high resolution and high accuracy pressure gauge is used to sense the pressure in the well. That is, the high resolution and high accuracy pressure gauge is used to sense the 'reaction' of the reservoir to a change in the flowrate. By measuring that 'reaction', one can determine a significant amount of information about the reservoir, such as the size of the reservoir, how much fluid is in the reservoir, the permeability of the reservoir, boundaries, and other important properties of the reservoir. The generation of the 'wavelet function' 22, 28, 32 is accomplished in numerous different applications, such as electromechanics, heat conduction, and the diffusion of medicine in the bloodstream.

When the Digital Pressure Derivative software 16 of the present invention practices the 'special method', the 'wavelet function' 22, 28, 32 (designed in response to our knowledge of the reservoir) is convolved, in a convolution 24 and 24a and 24b, with the 'second function 18 representing the pressure response of the reservoir including noise' to generate and obtain 'more information about the reservoir from the pressure gauges', namely, to generate a 'derivative 20 of the second function 18 representing the pressure response of the reservoir'. However, the aforementioned 'special method' practiced by the Digital Pressure Derivative software 16 of the present invention can also be utilized to obtain more information about other parameters, other than the 'pressure response of a reservoir'. That is, the 'special method' practiced by the Digital Pressure Derivative software 16 of the present invention can also include the convolution of 'another wavelet function' with 'another function representing any other measurement' for the purpose of obtaining more information about other parameters involved in or representing said measurement. For example, the 'special method' could be practiced by the Digital Pressure Derivative software 16 of the present invention in connection with the seismic business. That is, in connection with the seismic business, the 'special method' of the present invention would include the convolution 24 of 'still another wavelet function' (which was designed having knowledge of the seismic response of an Earth formation) with 'still another function representing a seismic measurement' for the purpose of obtaining more information about the seismic measurement (e.g., to obtain more information about the formation's response when an explosive or acoustic energy source propagates sound or acoustic waves in the Earth formation). To be more specific, in connection with the seismic business, the 'special method' practiced by the Digital Pressure Derivative software 16 of the present invention would include the convolution 24 of a 'wavelet function designed for measuring seismic waves or sound' with a 'seismic measurement including noise' for ultimately generating an 'output function substantially devoid of the noise' which will enable one to determine more information about the formation's response to the sound or acoustic waves propagating in the Earth formation.

Therefore, in FIG. 2, the 'special method' practiced by the Digital Pressure Derivative software 16 of the present invention includes: convolving a 'special wavelet' 22 with a 'signal' 18 in FIG. 2 that represents a 'function' which further represents the 'measurement of something including noise'. The aforementioned 'signal' 18 in FIG. 2 is a function that represents the 'measurement' of 'something' including any accompanying noise. The 'measurement' 18 of FIG. 2 can literally be anything, although, in the preferred embodiment of FIG. 3, the 'measurement' 18 in FIG. 3 is a pressure measurement in an oil or gas well of an oil or gas reservoir including accompanying noise.

In the preferred embodiment of FIG. 3, the 'wavelet function' is a derivative wavelet 28. During the interpretation of pressure, the derivative of the pressure is utilized because more accurate information can be obtained from the derivative. When the 'special method' is practiced by the Digital Pressure Derivative software 16 of the present invention, the aforementioned 'derivative wavelet function' 28 of FIG. 3 is convolved (in a convolution 24 in one of the above referenced convolution equations 16 or 17) with a 'particular function representing a pressure measurement in an oil or gas well' 18 of FIG. 3 and, responsive thereto, the 'derivative of that particular function substantially devoid of the noise' 20 of FIG. 3 is generated. As a result, in FIG. 3, the 'special method' practiced by the Digital Pressure Derivative software 16 of the present invention includes the convolution 24 of a 'derivative wavelet' 28 with 'a specific function' 18 (and recall that we want the derivative of that 'specific function') to thereby generate a 'result' 20 which represents a 'much higher resolution derivative of that specific function 18 substantially devoid of the noise' 20 in FIG. 3. That 'result' 20 is interpretable, as noted in step 30 of FIG. 3, because it is substantially devoid of the 'noise'; therefore, the 'result' 20 is interpreted and given to a customer. In general, therefore, when pressure is measured, a 'signal' 18 is generated which includes 'noise'. That 'signal' 18 having the 'noise' is convolved in a convolution 24, 24a, 24b with a 'wavelet function' 22, 28, 32 and the result 20, 20a, 20b of the convolution 24, 24a, 24b is a "much more accurate and much higher resolution derivative 20 of that signal 18", which is substantially devoid of the noise. The substantial absence of the noise from the 'much higher resolution derivative 20 of that signal 18' means that the 'much higher resolution derivative 20 of that signal 18', that is generated by the convolution 24, 24a, 24b, can be interpreted (as in step 30) by a customer. An example of the "much more accurate and much higher resolution derivative 20 of the signal 18", which is substantially devoid of the noise, is shown in FIG. 38 of the drawings.

Therefore, although 'signal processing technology' was previously totally separate from 'measurement technology', the 'special method' practiced by the Digital Pressure Derivative software 16 of the present invention shown in FIG. 1 includes (among other things as mentioned above) the combination of the 'signal processing technology' with the 'measurement technology', the 'measurement technology' further including the 'measurement of something, such as pressure'.

In FIG. 4, the second derivative of the pressure, measured in an oil or gas well, can yield even more information about the reservoir. However, the second derivative of the pressure has not been previously mentioned in the literature because 'overwhelming noise' is contained within the second derivative function. In accordance with another aspect of the present invention, the 'special method' practiced by the Digital Pressure Derivative software 16 of the present invention can now be extended in the following manner: apply the convolution twice, as shown in FIG. 4. That is, convolve a 'particular function' 18 of FIG. 4 representing an output signal from any measurement (such as an output signal from a pressure gauge which is making pressure measurements in an oil or gas well) with a 'wavelet function' 32a first time to generate a first output signal 20a representing a 'first derivative of the particular function 18', and then convolve the first output signal 20a representing the 'first derivative of the particular function 18' with the 'wavelet function' 32a second time to generate a second output signal 20b representing a 'second derivative of the particular function 18'. Instead of applying the convolution to the top curve in FIG. 28, we apply the convolution to the bottom curve in FIG. 28, which represents the first derivative. In FIG. 4, in connection with a particular function 18 representing a pressure measurement from a pressure gauge making pressure measurements in an oil or gas reservoir, a significant amount of information about the reservoir can be obtained from the 'second derivative 20b of the particular function 18' because the 'second derivative 20b of the particular function 18' is substantially devoid of any of the aforementioned 'overwhelming noise'. This is a very beneficial result that is obtained by using the 'special method' that is practiced by the Digital Pressure Derivative software 16 of the present invention.

Other applications for the DPDT method and apparatus and program storage device of the present invention are set forth hereinbelow.

The DPDT method and apparatus disclosed herein can generate a temporal or a spatial derivative substantially devoid of noise in many other applications and areas of technology in addition to and apart from the oilfield application described herein for generating the pressure derivative from downhole pressure measurements. For example, there are many applications in measurement and control systems, and other technologies where it is necessary to know the rate-of-change, derivative, or slope of a measured parameter or input signal, with respect to time, with respect to distance, or to another parameter or variable.

The DPDT can be applied wherever the mathematical derivative(s) of a data set or input signal is required and where the output is required to be substantially devoid of noise. Furthermore the source of that noise may be measurement uncertainty, limitations of the sensing device or transducer, its associated signal processing hardware or software; in other words, the noise may be either intrinsic or extrinsic to the source of the input data itself.

As shown previously, any noise accompanying the input signal, or any noise introduced by the associated signal processing hardware or software, is usually amplified by conventional derivative methods, thereby corrupting the desired derivative output. Since the DPDT method and apparatus disclosed herein are effective in producing an output substantially devoid of noise it can be applied in a wide variety of applications to significantly improve performance compared to other methods. In addition, these improvements can be made cost effectively wherever the required DPDT algorithm code and its associated processing hardware can be embedded into, or implemented within a parent system's resources of memory, computation and data processing hardware (i.e., wherever FIGS. 1 to 4, can be implemented as appropriate to a specific design and application). To illustrate the wide scope of potential applications and their advantages, a few such examples are described below; however, these examples are intended only for illustration purposes and are not intended to be exhaustive or to limit this method and apparatus, or their extensions in any way.

Type 1 Examples

In examples of type 1 applications, DPDT generates velocity and/or acceleration from measurements of linear position data containing noise. See FIG. 3 for application of DPDT once for velocity and FIG. 4 for application of DPDT twice for acceleration.

1.1) Wellbore logging cable speed, Coiled tubing speed, Pipe and other tubulars running in/out of hole speed indicator. DPDT uses position measurements from discrete marks on the cable, pipe or tube respectively, or from an intermediate roller. The marks may be made by any physically sensible means i.e., mechanical, electromagnetic, or sonic. The second derivative DPDT provides an input to the cable spooling motor or coil tubing driver to help limit the maximum acceleration, hence maximum stress on the cable or tube. Advantage: smooth accurate measurement and smooth control of spooling reel or tube running speed. This reduces stress and likelihood of cable or tubular breakage.

1.2) Elevators: DPDT provides velocity indicators using discrete position marks or distance measurements along wall or cable, similar to example 1 above. The second derivative DPDT provides an input to the elevator's motor controller to ensure a safe smooth ride and minimizes stresses on the equipment.

1.3) Aircraft: DPDT uses GPS derived position data to generate velocity in x, y, or z direction. Advantages: significant reduction in velocity error—especially needed during autopilot operations and during instrument assisted or during automated landing.

1.4) Aircraft: DPDT uses GPS derived data to generate rate of climb or rate of decent from GPS derived position data. Advantages: The result is a passive system in that it requires only GPS reception and internal processing but no radar or other electromagnetic emissions, thereby minimizing transmission interference and spectrum traffic congestion and for stealth operation. It requires no external measurements of pressure (i.e, no Pitot tube). It is independent of aircraft's attitude.

1.5) Aircraft: DPDT uses Radar derived ground height data to generate rate of climb/decent as above.

1.6) Aircraft collision avoidance: DPDT uses Radar to generate rate of closure with ground and other aircraft or obstructions. Aircraft's alarm and control system would use this information as an input to determine optimum collision avoidance strategy.

1.7) Aircraft traffic control and collision avoidance: The GPS location of each aircraft can be transmitted to a ground based traffic control system that itself employs DPDT to determine each aircraft's velocity vector and its altitude rate-of-change. The results would be substantially devoid of noise; hence they would have greater accuracy and certainty. The results in turn can be used for collision avoidance calculations.

1.8) Surface vehicle collision avoidance (i.e., cars, buses, trucks, trains, Ships etc.): DPDT uses either Radar or Sonar data to generate rate of closure with other vehicles or obstructions.

1.9) Subsurface vehicles (i.e., submarines, remotely piloted vehicles (RPVs), torpedoes, etc.): DPDT uses Sonar derived position data to generate rate of closure with other vehicles or obstructions.

1.10) Machine tools: DPDT provides velocity indicator based on position measurements to smoothly control the cutting operation to improve tolerance and finish and also minimize waste.

1.11) Automated assembly: DPDT provides smooth velocity and acceleration measurements from noisy position data. When used in a feedback control system, this minimizes acceleration-induced stresses on the parts, thereby minimizing part breakage and machine wear.

Type 2 Examples

In type 2 examples, DPDT generates angular velocity and/or angular acceleration from measurements of angular position data containing noise. See FIG. 3 for application of DPDT once for angular velocity and FIG. 4 for application of DPDT twice for angular acceleration.

Given angular position data containing noise, DPDT generates angular velocity substantially devoid of noise (see FIG. 3 for application of DPDT once). DPDT generates angular acceleration when applied twice (see FIG. 4).

2.1) Aircraft and missile roll, pitch, yaw control: DPDT generates substantially noise free calculations of the craft's angular velocity given angular position measurements from internally mounted sensors such as gyroscopes or external observations of the craft's angular position such as an optical horizon detector or optical star tracker. A second application of DPDT generates angular acceleration information (FIG. 4) for spin control systems.

Type 3 Examples

Automatic control systems: In automatic or feedback control systems, any specific design may be considered a subset or specific embodiment of the general control system design architecture called a proportional-integral-derivative (PID) controller. Here the derivative refers to the derivative of the input error signal (see Reference 61). This derivative, or time rate of change of the error, can provide a beneficial damping of a feedback control system. It can provide an anticipatory type of control that helps to minimize overshoot of the desired output. However, in practical implementations any noise in the error signal, or disturbances or errors in the control system itself present severe challenges to achieving the benefits of derivative control. As described in the disclosure, the typical derivative has the characteristics of a high-pass filter that tends to propagate, and sometimes amplify, noise and disturbances throughout the system. Application of the DPDT method and apparatus in these system applications can result in significant improvements in performance at minimum cost. A few examples of are:

3.1 Process control systems: for temperature, liquid or gas pressure, flow rate, or ph regulation.

3.2 Liquid level control 3.3 HVAC: Heating, Ventilation and Air Conditioning for furnace and cooling system control 3.4 Power supply control systems: for voltage, current, or generator frequency regulation.

3.5 Radar, sonar or telescope tracking systems.

3.6 Brightness controller for light sources or display systems.

3.7 Missile guidance systems based on GPS—advantage no electromagnetic emissions.

3.8 Ship roll stabilizer control systems—using rate of change (derivative) of gyroscopic orientation while minimizing errors due to gyro drift.

3.9 Robotics: for motion control, and sensor tracking and stabilization systems

Type 4 Examples

Spatial Derivatives 4.1 In surveying and civil engineering projects where the slope of a terrain or specific path is required but the input information consists of discrete position measurements that include noise (i.e., errors).

4.2 Electromagnetic system design and analysis: In electromagnetic field mapping the spatial derivative indicates the contours of the electrostatic field. The DPDT method applies with the time variable replaced by a spatial variable (i.e., the x, y, or z position relative to a reference coordinate system).

4.3 Heat transfer and thermodynamic modeling: This mathematical modeling requires the calculation of temperatures rate of change in space as well as time. DPDT can help minimize the detrimental effects of noise in the sense of computational errors.

4.4 Weather forecasting: The DPDT can improve the analysis of storms as well as the modeling and simulation of weather patterns because these use spatial derivatives of temperature and pressure versus time and spatial location. (See Reference 62).

DETAILED DESCRIPTION OF THE PREFERRED EMBODIMENT

2 Theoretical Considerations

In this section, we discuss the essentials of Digital Signal Processing required in developing the Digital Pressure Derivative Technique (DPDT). The discussion will be limited to only the necessary concepts and will be, whenever appropriate, within the context of acquiring pressure and rate measurements for well testing purposes. For a more definitive discussion, the curious reader may refer to several good texts on both the theory and application of DSP. See, for example, Refs. 18–38.

2.1 Frequency Domain Viewpoint

Most signal processing experts would agree that there are no fundamental advantages of processing data in the frequency domain over the time domain. It is however, instructive to look at the frequency dependence of the data. It is important to note that the same information is contained in each domain; one may simply provide us a more useful presentation or diagnosis of the data we are interpreting. From this point of view, the frequency domain is analogous to the Laplace domain; a related integral transform with which pressure transient analysts are more likely to be familiar. Several concepts, such as resolution, repeatability, signal to noise ratio, and systematic accuracy can be more easily visualized in the frequency domain than in time. While there are several advantages of looking at pressure transient data in the frequency domain, most important to us will be the ability to quantify the relationship between signal and noise; knowing that above some limiting frequency, only noise (i.e. non-reservoir phenomena) will be observed. In the following sections, we discuss the concepts involved in looking at measured pressure data in the frequency-domain rather than the time-domain.

2.2 Pressure Samples and the z-Transform

A sequence of n pressure measurements taken at uniformly spaced intervals of time, $\Delta t$, can be written as $$p[n]=p(0),p(1),p(2),\ldots,p(n) \tag{1}$$

where the sample times are $$0, \Delta t, 2\Delta t, \ldots, n\Delta t \tag{2}$$

We will assume, for now, that the interval $\Delta t$ is constant. The z-transform of the p[n] sequence in Eq. 1 is defined as the sum $$P[z] = p(0) + p(1)z^{-1} + p(2)z^{-2} + \ldots = \sum_{n=0}^{\infty} p(n) z^{-n} \tag{3}$$

where z is a complex variable. The relation given by the right-hand side of Eq. 3 is sometimes called the direct z-transform because it transforms the time-domain signal p(n) into its complex-plane representation P[z]. The z-transform plays an important role in the analysis of discrete-time signals. It plays the same role in the analysis of discrete-time analysis as the Laplace and Fourier transform plays in continuous-time analysis. That is, it greatly simplifies the analysis and design of discrete signal analysis by transforming a difference equation into an algebraic equation.

The functions p[n] and P[z] form a z-transform pair, denoted as $$p[n] \Leftrightarrow P[z] \tag{4}$$

Consider, for example, the unit sample or delta sequence defined by $$\delta[n] = \begin{Bmatrix} 1, & n = 0 \\ 0, & n \neq 0 \end{Bmatrix} \tag{5}$$

Then, from the definition in Eq. 4, the z-transform of the unit sample is $$\delta[n] \Leftrightarrow 1 \tag{6}$$

Another important function is the time shifted delta sequence $$\delta[n-k] = \begin{Bmatrix} 1, & n = k \\ 0, & n \neq k \end{Bmatrix} \tag{7}$$

Its z-transform follows from Eq. 7 and the definition given by Eq. 3 as $$\delta[n-k] \Leftrightarrow z^{-k} \tag{8}$$

The z-transform of a single pressure sample value p(n−k) taken at time (n−k)$\Delta t$ is $$p(n-k)\delta[n-k] \Leftrightarrow +p(n-k)z^{-k} \tag{9}$$

From a mathematical point of view, the z-transform is simply an alternative representation of a signal. This is nicely illustrated in the above example (Eqs. 5 through 9) in which the coefficient of $z^{-n}$ in a given transform is the value of the signal at time n. In other words, the exponent of z contains the time information we need to identify samples of the signal.

In many cases, we can express the sum of the finite or infinite series for the z-transform in a closed-form expression. In such cases the z-transform offers a compact alternative representation of the signal. This is illustrated in the following section.

2.3 The Digital Transfer Function

If the input, x[n], and the output, y[n], are sequences of a digital system and are related by a linear difference equation that has constant coefficients, the following notation may be used[18]

$$y[n]+a_1y(n-1)+\ldots+a_my(n-m)=b_0x(n)+b_1x(n-1)+\ldots+b_Nx(n-N) \tag{10}$$

Using the concepts from the previous section, we can take the z-transform of both sides of Eq. 10 (neglecting initial conditions) to obtain $$[1+a_1z^{-1}+\ldots+a_mz^{-m}]Y[z]=[b_0+b_1z^{-1}+\ldots+b_Nz^{-N}]X[z] \tag{11}$$

The digital transfer function is then defined as $$H(z) = \frac{Y(z)}{X(z)} = \frac{\sum_{i=0}^{N} b_i z^{-i}}{1 + \sum_{J=1}^{M} a_j z^{-j}} \tag{12}$$

Hence the output is the product of the input multiplied by the digital transfer function. That is, $$Y(z)=H(z)X(z) \tag{13}$$

Figure 5:
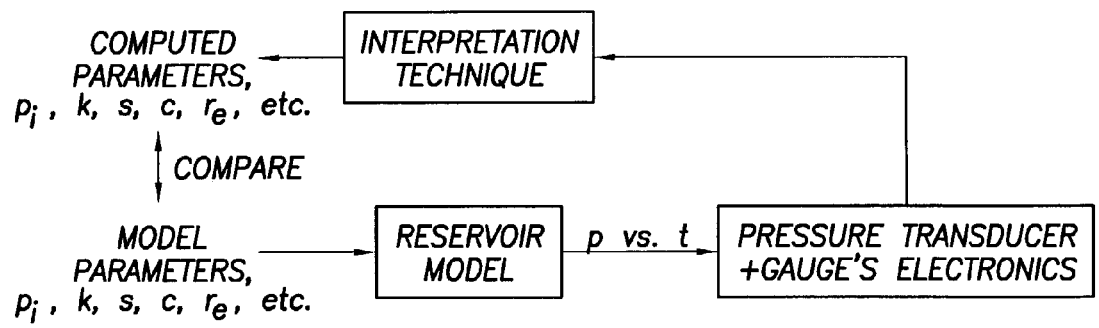

Alternatively, the transfer function may be computed as the z-transform of the unit impulse response of the system. Refer to FIG. 5.

The transfer function approach is used in many disciplines, particularly those involving electromechanical and signal processing systems. The transfer function technique applied to pressure measurement in well testing is discussed by Veneruso, et al.[9] This technique is a powerful tool which describes the well testing measurement process mathematically; that is, it relates the gauge output response to its input pressure and, possibly, temperature. Knowing this relationship, the analyst can more accurately design well tests based on expected reservoir response and known characteristics of the gauge, such as drift, resolution, temperature effects, etc. A diagram of how the transfer function is used in pressure transient design and analysis is shown in FIG. 5. The transfer function concept allows us to compute and appropriately interpret the measurement errors introduced into the pressure transient data. Accounting for these errors minimizes the risk of falsely interpreting measurement errors as reservoir features.

2.4 The Sampling Theorem

For each sampling interval, $\Delta t$, there exists a characteristic frequency, $f_N$, called the Nyquist frequency. The Nyquist frequency is related to the sampling interval by the following simple relation:

$$f_N = \frac{1}{2}\Delta t \tag{14}$$

If a continuous function, p(t), sampled at an interval $\Delta t$ is limited to frequencies smaller in magnitude than $f_N$, then the function p(t) is completely represented by its samples. This has remarkable implications, particularly in the areas of data compression and downhole recorder acquisition systems, because we can represent a continuous signal by a much smaller set of properly spaced samples. The proper spacing is related to the frequency content of the signal and specifically to the Nyquist frequency.

On the other hand, if the signal is not limited to frequencies below the Nyquist frequency, it turns out that the spectral information which lies outside of the frequency range $-f_N < f < f_N$ is folded back into this range and spuriously alters the spectral content within this range. This phenomenon is called aliasing. Any frequency component outside the Nyquist frequency range $(-f_N < f < f_N)$ is aliased into that range by insufficient sampling. Aliasing is illustrated in FIG. 6.

Figure 6:
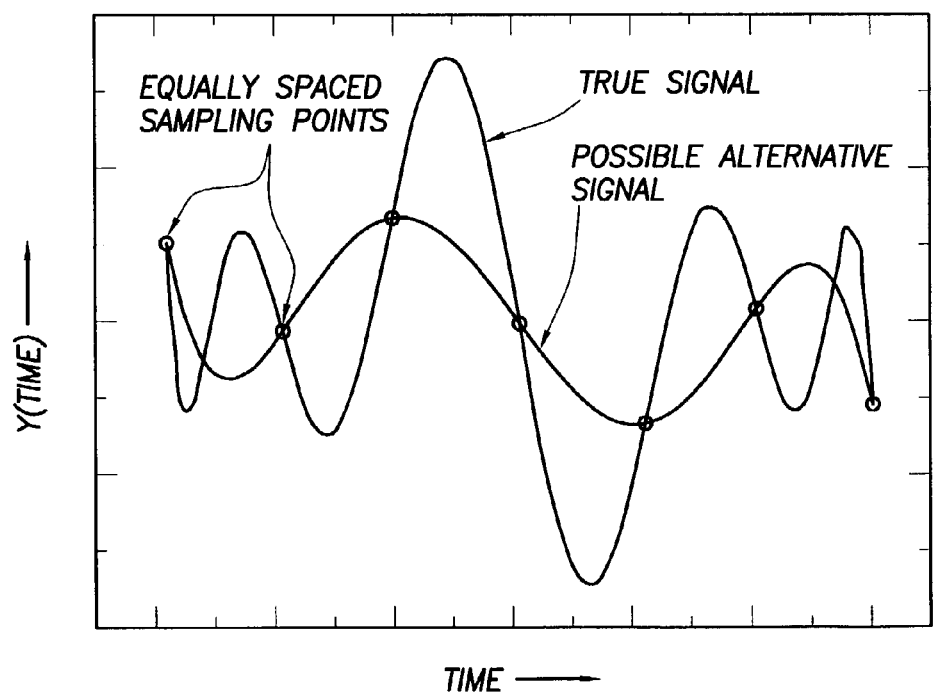

Refer to FIG. 6 for an illustration of Aliasing.

A slightly more robust explanation of the sampling theorem, taken from Proakas and Manolakis,[18] is given as follows:

If the highest frequency contained in an analog signal x(t) is $f_{max} = B$ and the signal is sampled at a rate $f_s > 2f_{max} = 2B$, then x(t) can be exactly recovered from its sample values using the interpolation function.

The sampling rate $f_N = 2B = 2f_{max}$ is called the Nyquist rate. Put differently, the Nyquist rate is the sampling limit—below which, the original signal cannot be reconstructed from the samples unambiguously.

2.5 Convolution

The concept of convolution is very basic to both digital signal processing and well testing. Anything so basic is bound to have several definitions and this is certainly true of convolution. Perhaps the easiest way of defining convolution is to first define its mathematical cousin, correlation. Correlation is a measure of how much two signals, or measurements, resemble each other, or, alternatively, a measure of the extent to which one signal can be considered a linear function of the other. Convolution is correlation with one of the signals reversed in direction and shifted by a desired number of samples. In the discrete form, the convolution operation may be expressed as follows:

$$y(n) = \sum_{m=0}^{N-1} h(m)x(n-m) \quad (15)$$

Equation 15 is often referred to as the superposition summation. For continuous signals, the summation is replaced by integration. In well test analysis, for example, it is interesting to convolve the pressure and flowrate as follows:

$$p_{wf}(t) = \int_0^t q(\tau) p'_{wf}(t-\tau) d\tau \quad (16)$$

Where q is the bottomhole flowrate and $p'_{wf}$ is the derivative of the bottomhole flowing pressure at a constant rate. The result, $p_{wf}(t)$, is the bottomhole flowing pressure with the rate variation accounted for. In this study, we will use Eq. 15 when we mention convolution.

Convolution has many properties such as being commutative, associative and distributive. The most important property for our purposes is that two functions (or signals) may be convolved in transform space (Fourier-, Laplace-, and z-transform) by a simple multiplication. That is, $$L^{-1}\{f(s)g(s)\} = \int_0^t F(\tau)G(t-\tau) d\tau \quad (17)$$

for the case of functions. Many other useful properties of convolution may be found in Churchill.[39]

2.6 Digital Filters

Filtering is a process by which the frequency spectrum of a signal can be modified, reshaped, or manipulated according to some desired specification. It may entail amplifying or attenuating a range of frequency components, rejecting or isolating one specific frequency component, etc. The digital filter is actually a digital system, which can be used to filter discrete-time signals. The digital filter can be implemented either in the hardware of the system or as a software component. The filters discussed in this work will be implemented as software (although, as discussed later, there is nothing prohibiting us from installing the DPDT algorithm in the firmware of a memory gauge).

Digital filters may be divided and subdivided into many categories; far too many to discuss for our purposes here. We will discuss only the special class of filters used in the DPDT—the causal, finite impulse response filter (FIR). The FIR filter, because of its method of implementation, is often called a non-recursive filter or a convolution filter. From the time-domain view of this operation, the FIR filter is sometimes called a moving-average filter. The duration (or sequence length) of the impulse response of these filters is, by definition, finite. Therefore, the output can be written as the finite convolution sum $$y(n) = \sum_{m=0}^{N-1} h(m)x(n-m) \quad (18)$$

where x(n−m) is the input data and h(m) is the length-N impulse response. The transfer function of this FIR filter is given by the z-transform of h(m) as $$H(z) = \sum_{m=0}^{N-1} h(m)z^{-m} \quad (19)$$

The frequency response of the filter is found by simply setting $z = e^{j\omega}$, which gives $$H(\omega) = \sum_{m=0}^{N-1} h(m)e^{-j\omega m} \quad (20)$$

where ω is frequency in radians per second. Strictly speaking, the exponent should be jωΔtm, where Δt is the time interval between the integer steps of m; that is, the sampling interval. As previously mentioned we are, for now, assuming that Δt is constant at unity (we will later drop this restriction in Section 3.1). The frequency, denoted by ω, in radians per second can also be expressed in hertz (cycles per second, f). These quantities are related by $$\omega = 2\pi f \quad (21)$$

The basic FIR filter design problem is (for our purposes) to determine the optimum value of N, the number of terms for h(m), and the values of h(m) for achieving the desired effect on the input signal. Our desired effect is to obtain the ideal derivative of the input signal (pressure versus time).

2.7 Conventional (Algebraic) Differentiators

From a transfer function point of view, a differentiator is a system whose output is the derivative with respect to time of its input. For example, if the input function is $$x = \sin(\omega t) \quad (22)$$

then the output is $$\frac{dx}{dt} = \omega \cos(\omega t) \quad (23)$$

This simple example, in addition to providing a convenient entrance into the frequency domain, provides new insight along with some powerful analytical tools. For example, the ideal differentiator's transfer function, FIG. 7, has a frequency response that is linearly proportional to the frequency and has a constant phase shift of 90 degrees. We will now examine conventional differentiators using this same approach; that is, examining the linearity of the magnitude-frequency response.

Figure 7:
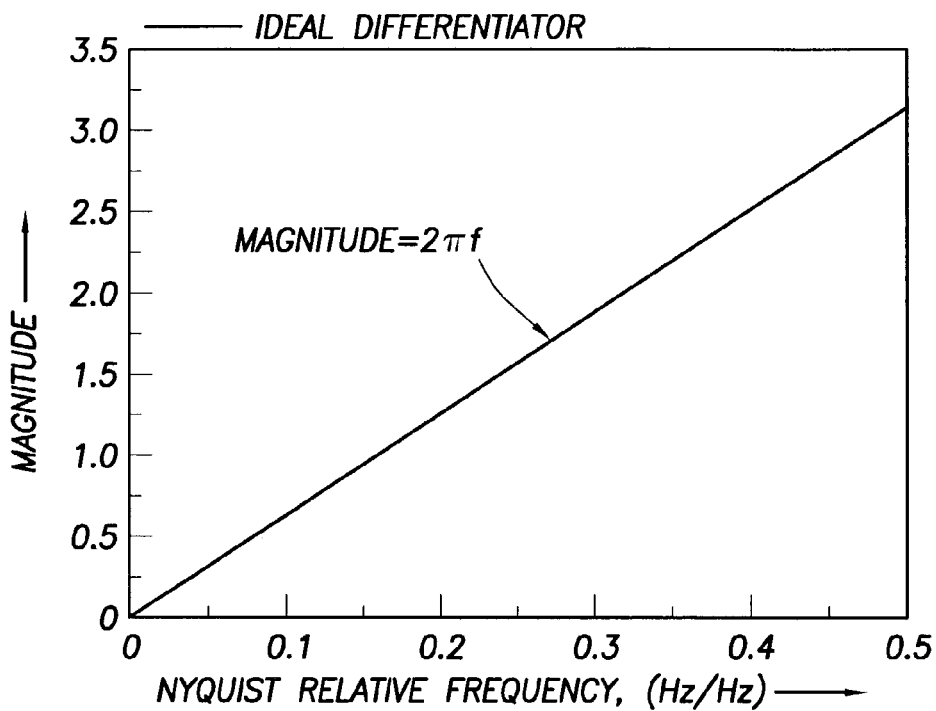

Refer to FIG. 7 for a Frequency Response of an Ideal Differentiator

A common method for computing numerical derivatives is the Newton two-point method, given by $$y(n) = \frac{1}{\Delta t}[x(n) - x(n-1)] \quad (24)$$

Figure 8:
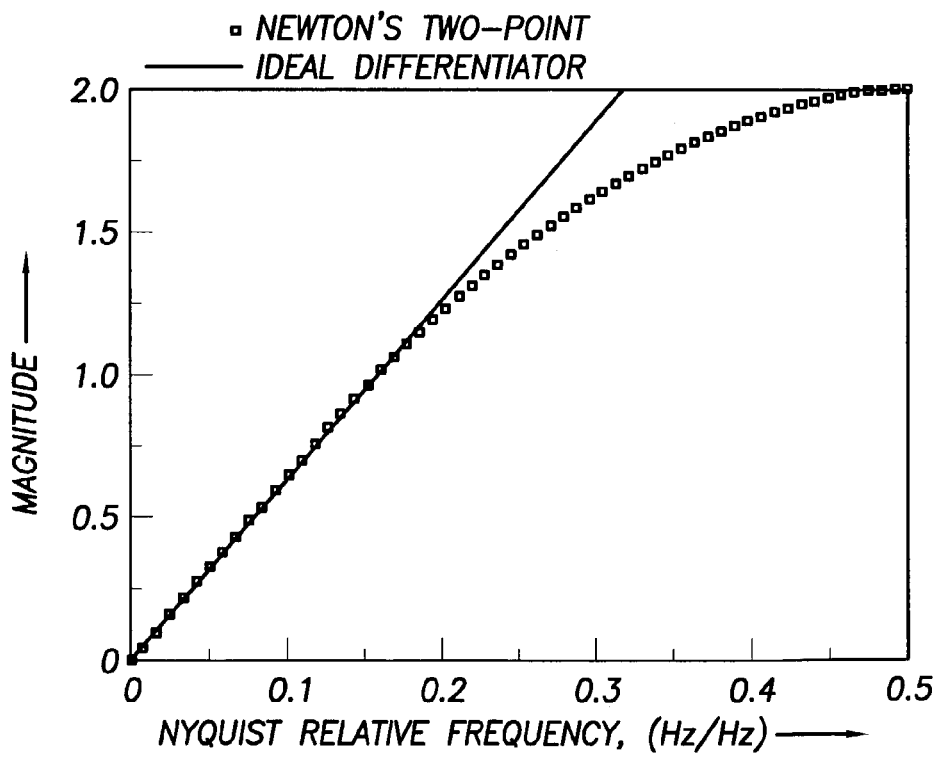

The problem with this method is clearly shown in FIG. 8; it is a highpass filter. FIG. 8 was computed by finding the n-point frequency response, $H(e^{j\omega})$, of the digital filter defined by the difference equation, Eq. 24.

Refer to FIG. 8 for a Comparison of Newton and Ideal Derivatives

It approximates the ideal differentiator only at very low frequencies; that is, below about 0.2 times the Nyquist frequency. At higher frequencies, its behavior approaches that of an amplifier with a gain of two. This behavior can be explained using FIG. 9. At low frequencies (relative to the Nyquist frequency) the sampling points A and B are close together; hence, their difference closely approximates the derivative of the sinusoid.

To see this mathematically, let $$t_B = t_A + \Delta t \quad (25)$$

where $\Delta t$ is infinitesimally small. Hence, $$\frac{\{\sin(\omega t_A) - \sin(\omega t_B)\}}{\delta t} = \frac{\{\sin(\omega t_A) - \sin[\omega(t_A + \delta)]\}}{\delta t} \quad (26)$$

$$= \frac{\cos(\omega t_A)\sin(\omega \delta t)}{\delta t} \quad (27)$$

$$\cong \omega \cos(\omega t_A) \quad (28)$$

At high frequencies (close to the Nyquist frequency), the sampling points have wider spacing, as shown by points C and D. Their difference is approximately twice the amplitude of the sinusoid. Therefore, the output has a gain to two. Mathematically, we have $$t_B = t_A + \frac{\pi}{2\omega} \quad (29)$$

Hence, $$\frac{\{\sin(\omega t_A) - \sin(\omega t_B)\}}{\delta t} = \frac{1}{\delta t}\{\sin(\omega t_A) - \sin[\omega(t_A + \frac{\pi}{2\omega})]\} \quad (30)$$

$$= 2\sin(\omega t_A) \quad (31)$$

Figure 9:
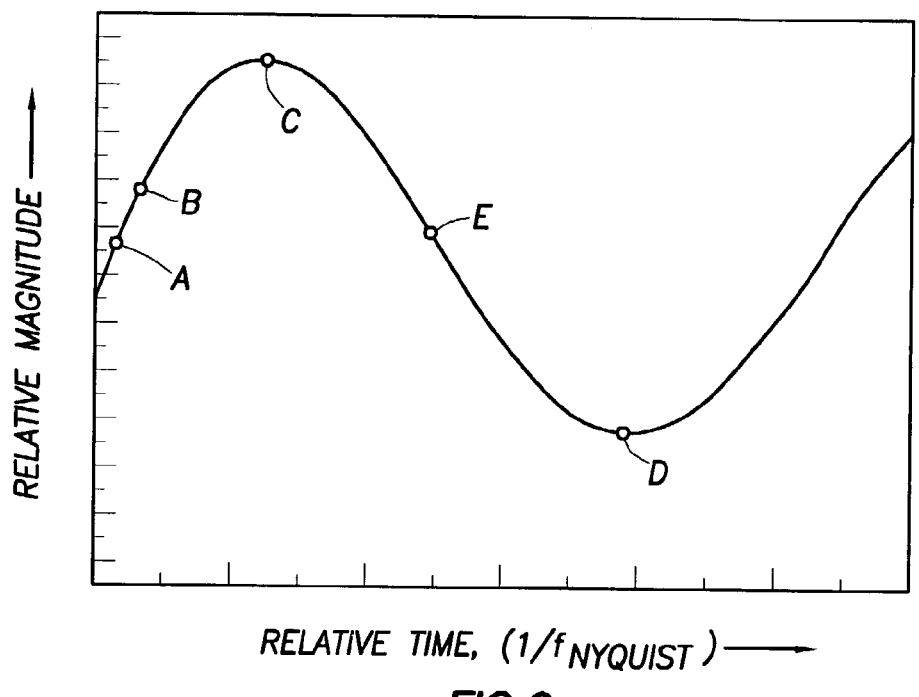

Refer to FIG. 9 for a Sampling for Conventional Differentiators

Another popular method of numerically computing derivatives is given by Stirling's central difference formula, $$y(n) = \frac{1}{2\Delta t}\{x(n+1) - x(n-1)\} \quad (32)$$

This method approximates the ideal differentiator only at very low frequencies as in the Newton method. The frequency response of the Stirling central difference formula is presented in FIG. 10. The sampling points for this method are given by C and E in FIG. 9.

Figure 10:
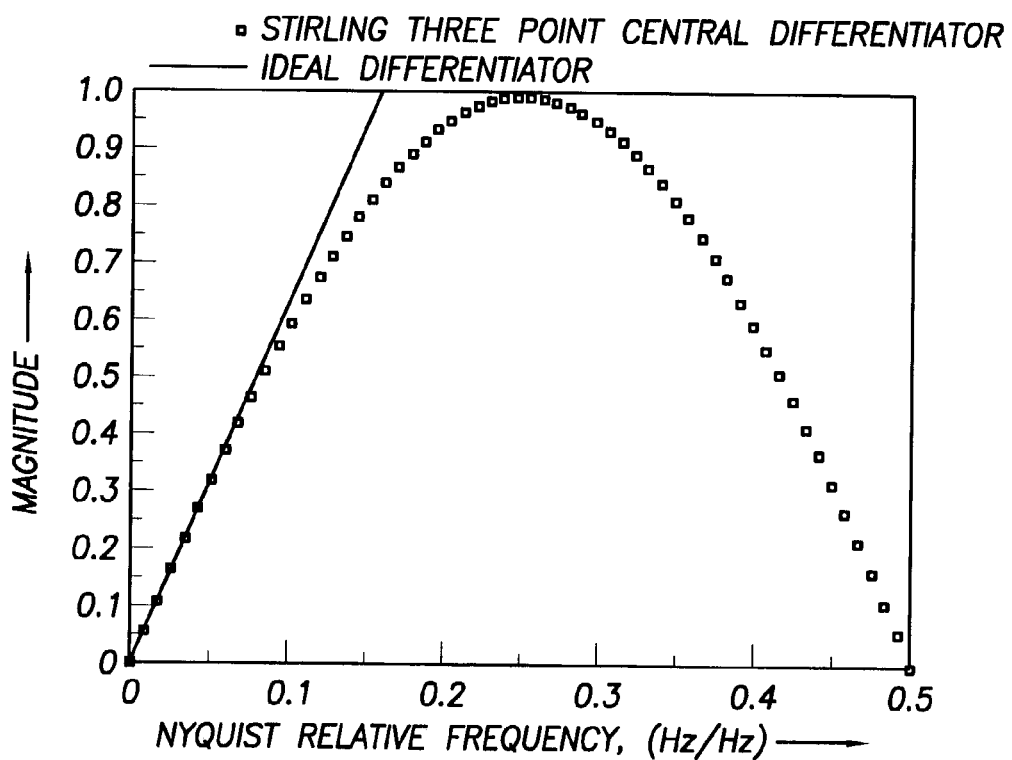

Refer to FIG. 10 for a Comparison of Stirling and Ideal Derivatives

To conclude this section, we may note that while the Newton two-point difference method is a better match to the ideal differentiator (see FIG. 8), the Stirling central difference formula is very useful when the attenuation of high frequencies is desired.

2.8 The Ideal Digital Differentiator

As mentioned above, an ideal differentiator has a frequency response that is linearly proportional to the input frequency. Similarly, an ideal digital differentiator is defined as one that has the frequency response $$H(\omega) = j\omega, \quad -\pi \leq \omega \leq \pi \quad (33)$$

The unit sample response corresponding to $H(\omega)$ is $$h(n) = \frac{1}{2\pi}\int_{-\pi}^{\pi} H(\omega)e^{j\omega n}d\omega \quad (34)$$

$$= \frac{1}{2\pi}\int_{-\pi}^{\pi} j\omega e^{j\omega n}d\omega \quad (35)$$

$$= \frac{\cos \pi n}{n}, \quad -\infty < n < \infty, n \neq 0 \quad (36)$$

The unit sample response is anti-symmetric; that is, $h(n) = -h(-n)$. Therefore, $h(0) = 0$. The ideal digital differentiator is simply a filter of length N, with $h(n)$ being the filter coefficients. There are numerous methods available for computing these coefficients. It is outside the scope of this specification to describe them here. For discussions of these methods, see, for example, Refs. 18, 19 and 20. The filter design method used in this work is formulated as a Chebyshev approximation problem. This approach is the optimum design method in the sense that the weighted approximation error between the desired frequency response and the actual frequency response is spread evenly across the frequency range. The Chebyshev approximation method is the most accurate but not necessarily the most efficient in terms of required CPU time. There are simpler techniques, such as the windowing method[18] and the frequency-sampling method.[18,19] These methods are relatively simple; however, they have disadvantageous features when applied in a general manner. Considering our application, we have chosen the Chebyshev technique primarily for its accuracy.

The Chebyshev approximation method for designing the ideal differential filter involves the solving of a set of linear equations of the form $$H(\omega_n) = \sum_{k=0}^{L} c_k \cos(2\pi k \omega_n) + (-1)^n \delta \quad (37)$$

where L is the number of extremal frequencies, $\omega_n$. The parameters $c_k$ and $\delta$ are determined by solving the set of equations using a method known as the Remez exchange algorithm.[40] The inputs to this algorithm are the design characteristics of the filter.

Namely, the filter length, N, the desired bandwidth (cutoff frequency, $f_c$), and the peak relative error, $\delta$, of the approximation. The value of the cutoff frequency can be determined by the pressure data itself as discussed later in Section 2.10.

In FIG. 11, the Remez exchange algorithm was popularized by Parks and McClellan[41] and was implemented in the software described in Section 3.6. An example of a differentiator design using this algorithm is given below. Here, the filter length is 60, the cutoff frequency is 0.1 and the maximum (stopband) frequency is 0.15. The coefficients are shown graphically in FIG. 11. The frequency response of the coefficient wavelet is illustrated in FIG. 8. As expected, the magnitude is proportional to the frequency until the cutoff frequency, $f_c$=0.1, is reached.

Finite Impulse Response (FIR) Linear Phase Digital Filter Design Remez Exchange Algorithm Differentiator Filter Length=60

***Impulse Response***

H(1)=−0.12477990E−02=−H(60)
H(2)=−0.15714090E−02=−H(59)
H(3)=0.36846900E−02=−H(58)
H(4)=0.19298350E−02=−H(57)
H(5)=0.14264350E−02=−H(56)
H(6)=−0.17615030E−02=−H(55)
H(7)=−0.43110670E−02=−H(54)
H(8)=−0.46953740E−02=−H(53)
H(9)=−0.14105680E−02=−H(52)
H(10)=0.41693920E−02=−H(51)
H(11)=0.85736330E−02=−H(50)
H(12)=0.79813530E−02=−H(49)
H(13)=0.11834000E−02=−H(48)
H(14)=−0.87395690E−02=−H(47)
H(15)=−0.15401860E−01=−H(46)
H(16)=−0.12878510E−01=−H(45)
H(17)=−0.18835070E−03=−H(44)
H(18)=0.16620460E−01=−H(43)
H(19)=0.26741550E−01=−H(42)
H(20)=0.20892110E−01=−H(41)
H(21)=−0.18583160E−02=−H(40)
H(22)=−0.31109860E−01=−H(39)
H(23)=−0.48822210E−01=−H(38)
H(24)=−0.38673550E−01=−H(37)
H(25)=0.36759080E−02=−H(36)
H(26)=0.65462430E−01=−H(35)
H(27)=0.12066320E+00=−H(34)
H(28)=0.14182140E+00=−H(33)
H(29)=0.11403770E+00=−H(32)
H(30)=0.43620080E−01=−H(31)

Refer to FIG. 11 for a Coefficient Wavelet from the Remez Exchange Algorithm

Figure 12:
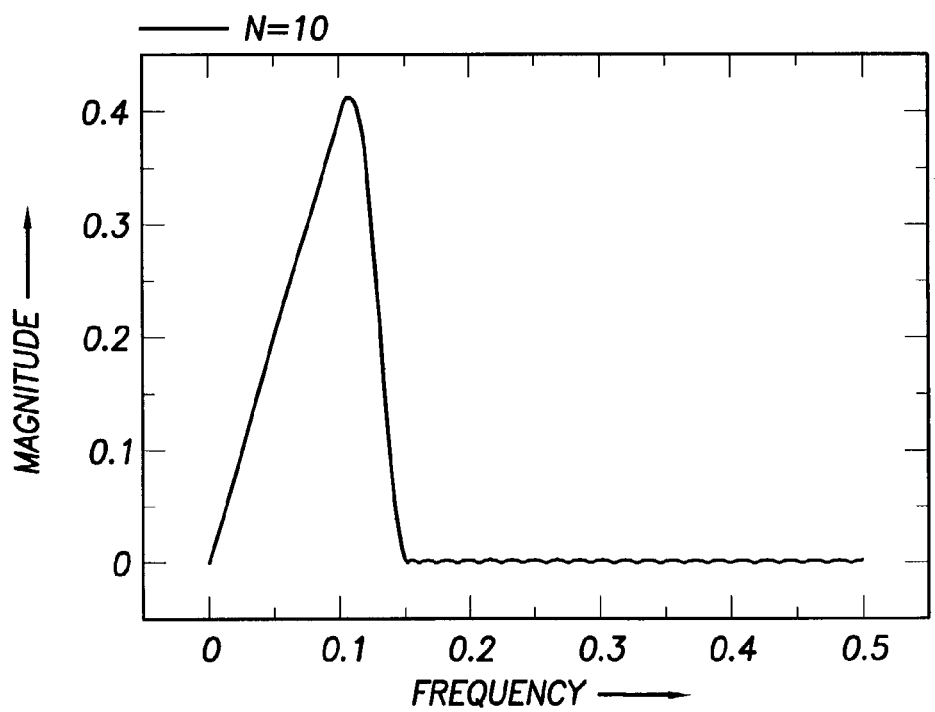

Refer to FIG. 12 for a Frequency Response of the Coefficient Wavelet of FIG. 11.

2.9 Autocorrelation

Correlation, as noted above, is simply a measure of similarity. The correlation of a signal, say x(t), with itself is called the autocorrelation. The autocorrelation function, while not used directly in this work, is presented briefly here in preparation for the ensuing discussion on the power spectral density.

Simply stated, the autocorrelation function, $R_x(\tau)$, is a measure of the similarity between x(t) and its delayed version x(t+$\tau$). For example, if $R_x(\tau)$ is a large positive number, then x(t) strongly resembles x(t+$\tau$). Therefore changes in x(t) will be reflected in proportional changes in x(t+$\tau$). Equivalently, that $R_x(\tau)$ has large negative value implies that changes in x($\tau$) are inversely related to changes to x(t+$\tau$). Finally, $R_x(\tau)$ having a value of zero indicates that x(t) and x(t+$\tau$) have, on the average, very little in common.

There is another, less obvious interpretation of correlation. If for some t, $R_x(\tau)$ is large, x($\tau$) has a tendency to repeat itself every t seconds (or samples). That is, x(t) will exhibit periodic behavior at a frequency of 1/t Hz. Therefore there is a connection between the autocorrelation function and the frequency domain.

2.10 Power Spectral Density

The frequency-domain representation of the autocorrelation function is called the power spectral density (PSD), or power spectrum. The power spectrum of a signal x(t), is a measure of the energy or power contained in x(t) at each frequency. A power spectrum analysis of a signal can therefore be used to locate the frequency locations where either the signal or noise energies reside. We will utilize the power spectral density to determine at which frequency the reservoir signal becomes insignificant when compared to the total measured signal. More precisely, the power spectral density will dictate the cutoff frequency required by the Remez exchange algorithm. The cutoff frequency is perhaps the most important factor in designing the filter wavelet and, for this reason, we can justify a discussion on the computational method used in this specification for computing the power spectral density.

The power spectral density may be computed a number of different ways. Simple techniques include (1) computing the Fast-Fourier transform (FFT) of the autocorrelation of the signal and (2) multiplying the FFT by the complex conjugate of the signal. The basic references on spectral estimation include the books by Bartlett,[42] Blackman and Tukey,[43] Grenander and Rosenblatt[44] and Hannan.[45] More recent books include those by Jenkins and Watts[46] and Koopmanns.[47] For the casual reader, we recommend the more comprehensible description given by Press, et al.[48]

The problem with computing the power spectral density is that there is not a definitive method. To compute the PSD analytically, we need more information from the signal than is normally available. Most methods therefore employ estimation theory and empirical insights gained from practical experience. Most modern (computerized) methods for computing the PSD employ the periodogram. A periodogram is simply an estimate of the power density spectrum; estimated using the technique mentioned above of computing the Fourier transform of the autocorrelation estimate, $R_x$. Mathematically, the periodogram, $I_N(\omega)$, is defined as $$I_N(\omega) = \sum_{m=-(N-1)}^{N-1} R_x(m) e^{-j\omega m} \tag{38}$$

In general, the periodogram estimate is not a consistent estimate of the spectrum and its behavior becomes erratic as N, the length of the sequence, increases. A somewhat standard approach to reducing the variance of periodogram estimates is to average over a number of independent estimates. The application of this approach to spectrum estimation is attributed to Bartlett.[42] In this approach, the data sequence, x(n), $0 \leq n \leq N-1$, is divided into K segments of M samples each so that N=KM; that is, we form the segments $$x^{(i)}(n) = x(n+iM-M); \ 0 \leq n \leq M-1, \ 1 \leq i \leq K \tag{39}$$

and compute the K periodograms $$I_M^{(i)}(\omega) = \frac{1}{M} \left| \sum_{n=0}^{M-1} x^{(i)}(n) e^{-j\omega n} \right|^2, \ 1 \leq i \leq K \tag{40}$$

The spectrum estimate is defined as $$B_{xx}(\omega) = \frac{1}{K} \sum_{i=1}^{K} I_M^{(i)}(\omega) \tag{41}$$

The problem with this method is that for a fixed sequence length, as the number of periodograms increases, the variance decreases but M also decreases, and therefore the spectrum resolution decreases. Thus there is a tradeoff between spectrum resolution (bias) and the variance of the estimate. Furthermore, the choice of M and N is normally through trial and error or given by prior knowledge of the signal being considered.

Welch[49] introduced a modification to the Bartlett procedure that eliminates the dilemma of optimizing accuracy at the expense of resolution. This method uses the FFT directly and is easily coded. We utilize this method in the software described in Section 3.6.

We will now utilize this robust method of Welch to compute the power spectral density of several common reservoir models. The purpose of doing this at this point in the work is to determine the sensitivity and the relationship, if any, of the PSD to the measured pressure response during a well test. We realize that using analytical solutions prevents us from noting the effect of measurement noise on the PSD and we approach this problem later in the study. At this point we are interested in the effect of model response on the PSD. Later in the discussion (Section 3.4) we will consider how to utilize the computed PSD to provide input into the DPDT algorithm.

The models considered were:
(1) Fully Penetrating, Finite Radius, No WBS—Homogeneous—Infinite
(2) Fully Penetrating, Finite Radius, No WBS—Two-Porosity-PSS—Infinite
(3) Fully Penetrating, Finite Radius, w/WBS—Homogeneous—Infinite
(4) Fully Penetrating, Finite Radius, w/WBS—Homogeneous—Closed Circle The dimensionless pressure response for each case was computed in the Laplace domain at a constant, unit interval and were numerically inserted into the time domain using the algorithm given by Stehfest.[7] The power spectral density was computed for each response using the method of Welch. The results are shown in FIG. 13.

Figure 13:
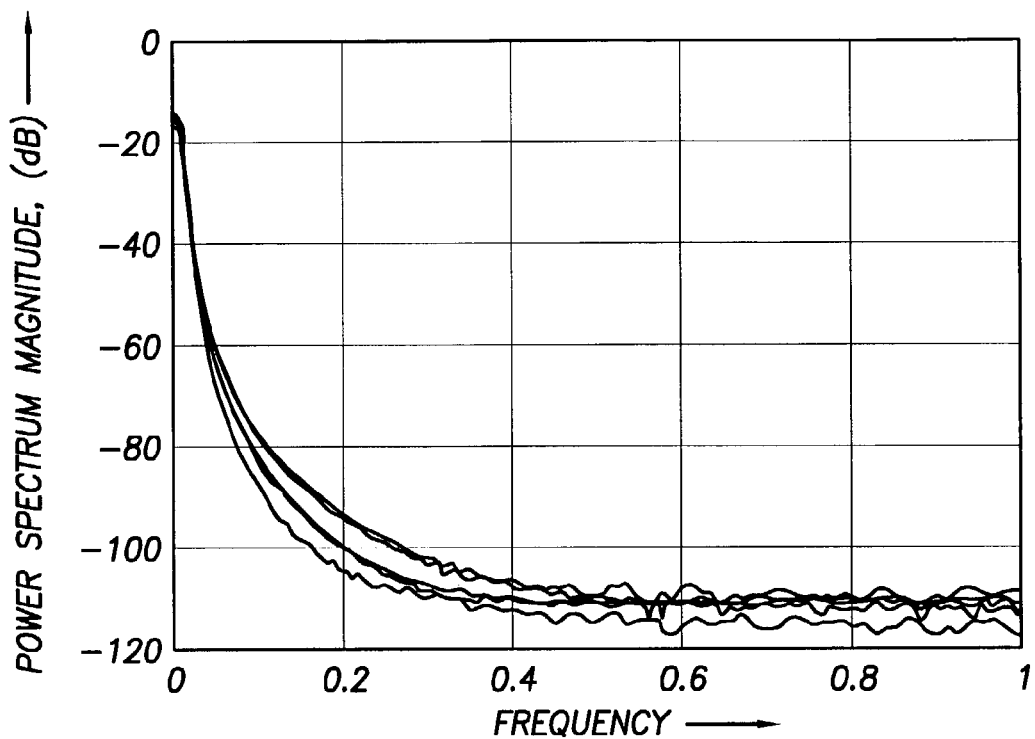

Refer now to FIG. 13.

From FIG. 13, we may draw two conclusions. The first is that the PSD, in general, is quite insensitive to the well/reservoir behavior. This is good news since we rarely know the system behavior a priori. Knowing that the PSD will have the same character regardless of the well/reservoir model allows one to confidently distinguish the reservoir signal from the noise. The second conclusion is that the majority of the energy (or power) is contained in the very low frequency range. This agrees with intuition; we expect the reservoir to have a lower characteristic frequency than noise in the system due to, say, vibration of the gauge. From FIG. 13, we may cautiously draw the conclusion that beyond the normalized frequency of 0.4, the total signal will most likely be dominated by noise.

3. Practical Considerations

Thus far, we have concerned ourselves only with the ideal situation of regularly sampled data of well-behaved analytical functions. The challenge we address in the following sections is to apply the previously discussed concepts to the real-world situations of irregularly sampled pressure measurements; data which many times contain artifacts of gauge malfunctions, phase behavior, variable flowrate, etc. We stress at this point the importance of separating these physical effects from the more subtle deficiencies inherent in the measurement process, such as insufficient resolution, aliasing, transmission effects, truncation effects, digital noise, differentiation effects, etc.

3.1 DPDT Computation

Before we approach the practical problems encountered when applying the DPDT to typical well test data, we summarize the computational procedure using the simple example of a sine wave with random (white) noise added for illustrative purposes. The input function is given as $$\text{signal} = 5000 + \sin(0.04\pi t) + 0.1 * \text{rand}(t) \tag{46}$$

where t=0 to 300 seconds and the function rand produces random numbers between 0 and 1, reseeded each time with the current value of t. A plot of Eq. 46 together with the finite-difference derivative is given below in FIG. 14. (The derivative has been shifted vertically to accommodate a common scale).

Figure 14:
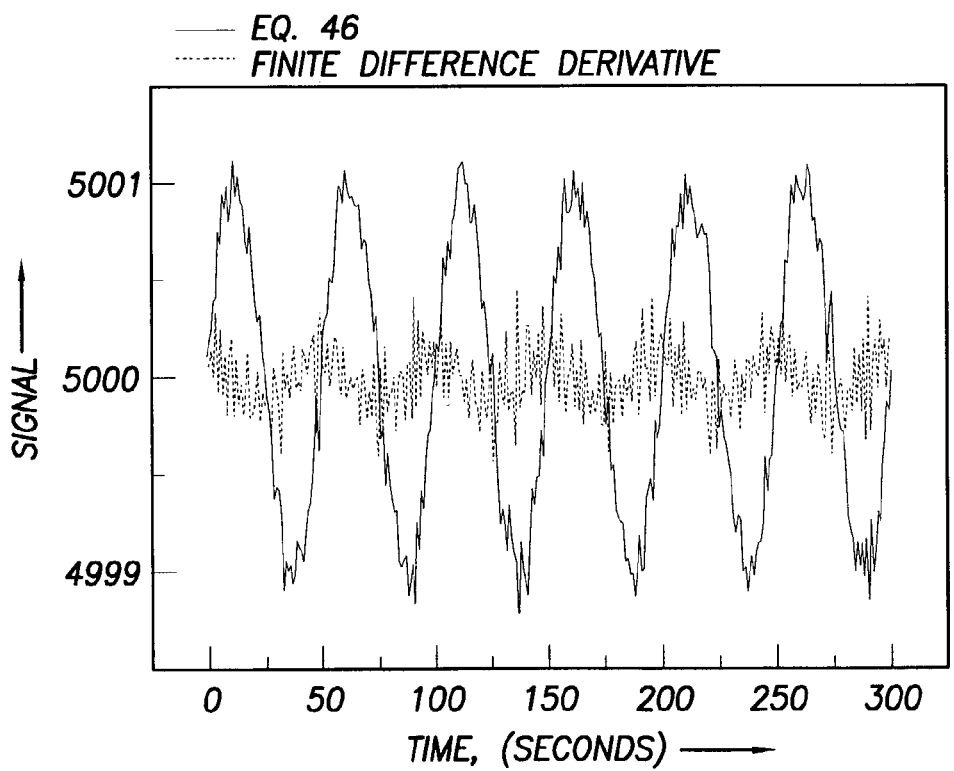

Refer to FIG. 14 for an Input Signal and Finite Difference Derivative

The steps involved in computing the Digital Pressure Derivative are as follows:
1. A wavelet is designed using a band limited transform of the ideal differentiator (i.e., $\cos(\pi n)/n$) as described in Section 2.8. The coefficients of the wavelet are computed using a Chebyshev method using the Remez exchange algorithm. The primary inputs to the algorithm are the filter length, N, and the cutoff frequency, $f_c$, which is the frequency, above which, noise is the principal component of the total signal. For illustration purposes, we arbitrarily choose a filter length of 60 although, as we will see later in the discussion, N may be computed using empirical formulas.

Figure 15:
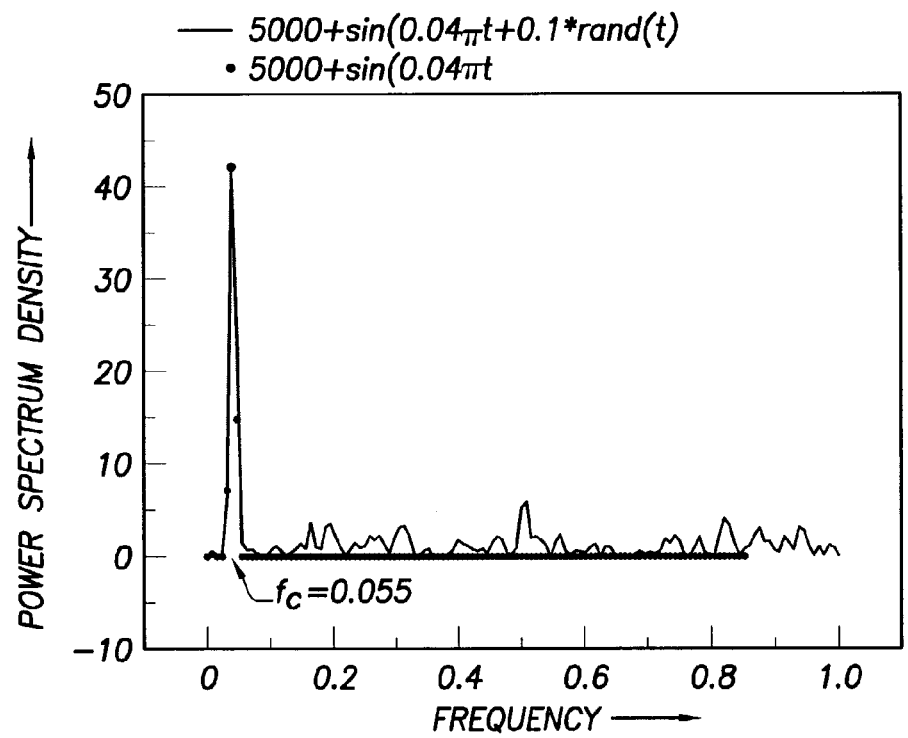

2. The cutoff frequency is determined by computing the power spectral density of the signal and picking the frequency at which the energy of the signal becomes a minimum. In this example, because we know what the true signal is (a sine wave), we can pick this minimum precisely by noting the frequency at which the true signal's spectrum deviates from that of the noisy signal. A comparison of the signal's spectrum is shown in FIG. 15. The cutoff frequency from the figure is $f_c=0.055$.

3. Using these values as input, the resulting coefficients, h(m) are convolved with the input signal at each sample in time, t, to produce the digital derivative, d(signal)/d(t). That is, $$DPDT(t) = \sum_{m=0}^{N-1} h(m)\text{signal}(t-m) \qquad (47)$$

Figure 16:
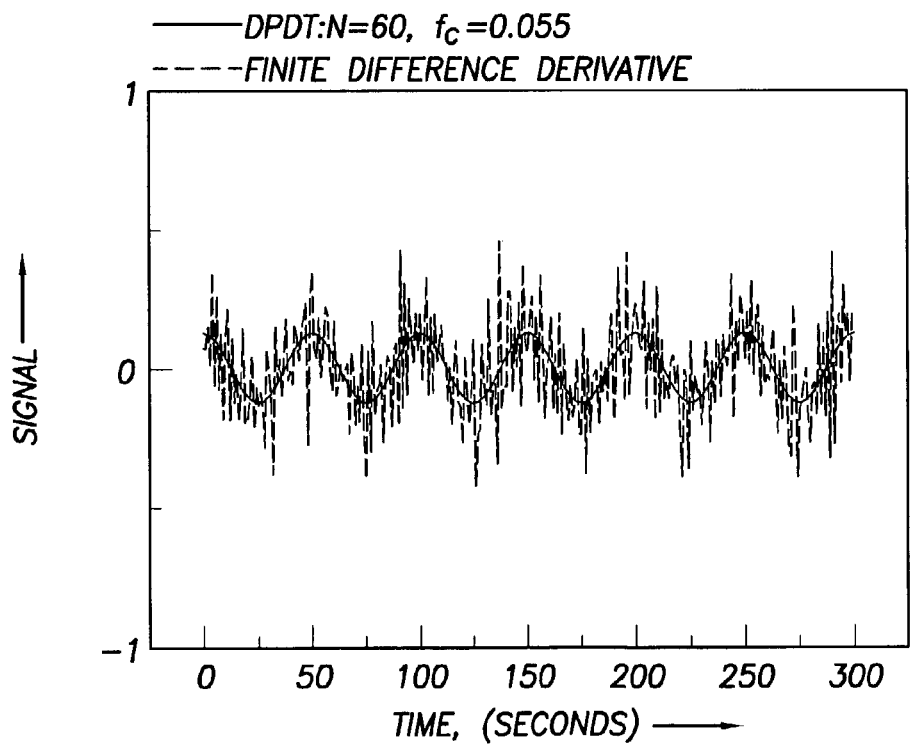

The resulting DPDT is shown in FIG. 16.

Refer to FIG. 15 for a Comparison of the Signal and Signal+Noise Spectrums

Refer to FIG. 16 for a Comparison of Finite Difference Derivative with DPDT

3.2 Data Sampling Issues

The theory presented in DSP literature implicitly assumes that the signal has been sampled at a constant and unit interval. Thus far, we have likewise considered only the simplified scenario in which pressure is measured at a constant and unit sample interval along the time axis. In well testing, this idealized sampling rate rarely occurs. In many cases, sophisticated gauges sample the pressure based on the pressure change between two (possible) time indices. In other cases, the data may be sampled regularly, at a constant rate, only to be decimated later in the processing or interpretation stage. Finally, we must also consider the situation in which consecutive data points are missing, due to such practical problems as gauge failure. To completely generalize the DPDT algorithm, we must consider a variety of possible non-uniform sampling schemes.

An exhaustive literature search yields several approaches for computing the power spectral density for irregularly sampled data. The method used here is taken from Press, et al.[48] For an additional, less rigorous method, see Childers.[37] Press, et al.,[51] basically recasts an earlier solution given by Lomb and extended by Scargle.[52] The Lomb method evaluates data only at times ti, which are actually measured. Suppose, for example, that there are N data points $h_i=h(t_i)$, i=1, ..., N. The mean and the variance of the data are found, respectively, by the formulas $$\bar{h} = \frac{1}{N}\sum_{1}^{N} h_i \qquad (48)$$

and $$\sigma^2 = \frac{1}{N-1}\sum_{1}^{N}(h_i - \bar{h})^2 \qquad (49)$$

The Lomb normalized periodogram is defined by $$P_N(\omega) = \qquad (50)$$

$$\frac{1}{2\sigma^2}\left\{\frac{\left[\sum_j (h_j - \bar{h})\cos\omega(t_j-\tau)\right]^2}{\sum_j \cos^2\omega(t_j-\tau)} + \frac{\left[\sum_j (h_j - \bar{h})\sin\omega(t_j-\tau)\right]^2}{\sum_j \sin^2\omega(t_j-\tau)}\right\}$$

where $\tau$ is defined by the relation $$\tan(2\omega\tau) = \frac{\sum_j \sin(2\omega t_j)}{\sum_j \cos(2\omega t_j)} \qquad (51)$$

The constant, $\tau$, is basically an offset that makes $P_N(\omega)$ completely independent of shifting all of the $t_j$'s by any constant. Once the normalized periodogram, $P_N(\omega)$, is computed, the Welch algorithm may be used exactly as in Section 2.10 to estimate the power spectrum density. While implementation of this Lomb/Welch method is straightforward, the algorithm is much slower than that for equally spaced data.

We now consider the computation of the DPDT for irregularly sampled data. In the case of a constant but non-unit sampling rate, the computed DPDT can simply be normalized with respect to the time interval. That is, $$DPDT(i) = \frac{DPDT(i)}{\Delta t} \qquad (52)$$

In the case of a non-uniform sampling interval, the solution is not as straightforward. One rather obvious solution is to simply interpolate the given time array onto a grid of constant intervals and proceed using Eq. 52. This technique has several disadvantages; not the least of which is the creation of false data points. Furthermore, interpolation itself, regardless of the method, introduces error, which will be magnified upon differentiation.

The solution originally pursued was the following: Compute the wavelet coefficients normally using the Remez exchange algorithm as described in Section 2.8. The set of resulting coefficients may then be fitted with a simple periodic function. The resulting function may be used to compute the coefficients required at the appropriate spacing, consistent with the spacing of the measured data. As an example, let us consider the pressure measurement shown in FIG. 17.

Figure 17:
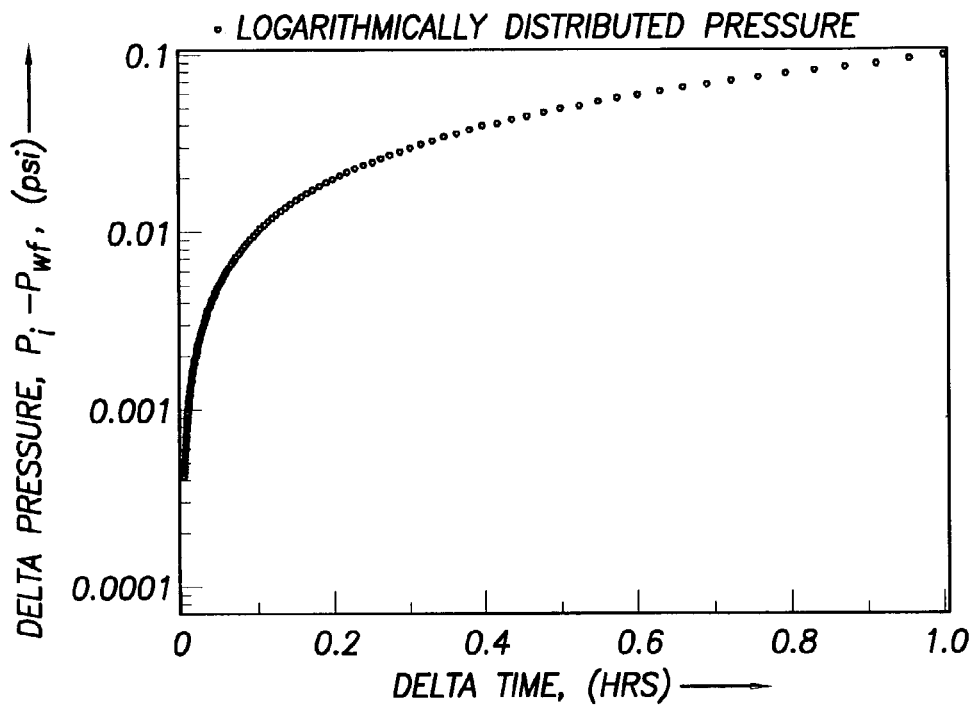

Refer to FIG. 17 for Pressure Data with Logarithmic Sampling

The points are logarithmically distributed in time, which is common in transient pressure acquisition given the logarithmic behavior of the pressure diffusion process. Furthermore, analytical solutions to the diffusivity equation, which also must be differentiated for type-curve matching, are typically computed on a logarithmic grid. In this example (FIG. 17) the pressures were computed using Eq. 42 on a logarithmic time grid of 50 points per cycle. The Remez coefficients resulting from this time distribution are shown in FIG. 18.

Figure 18:
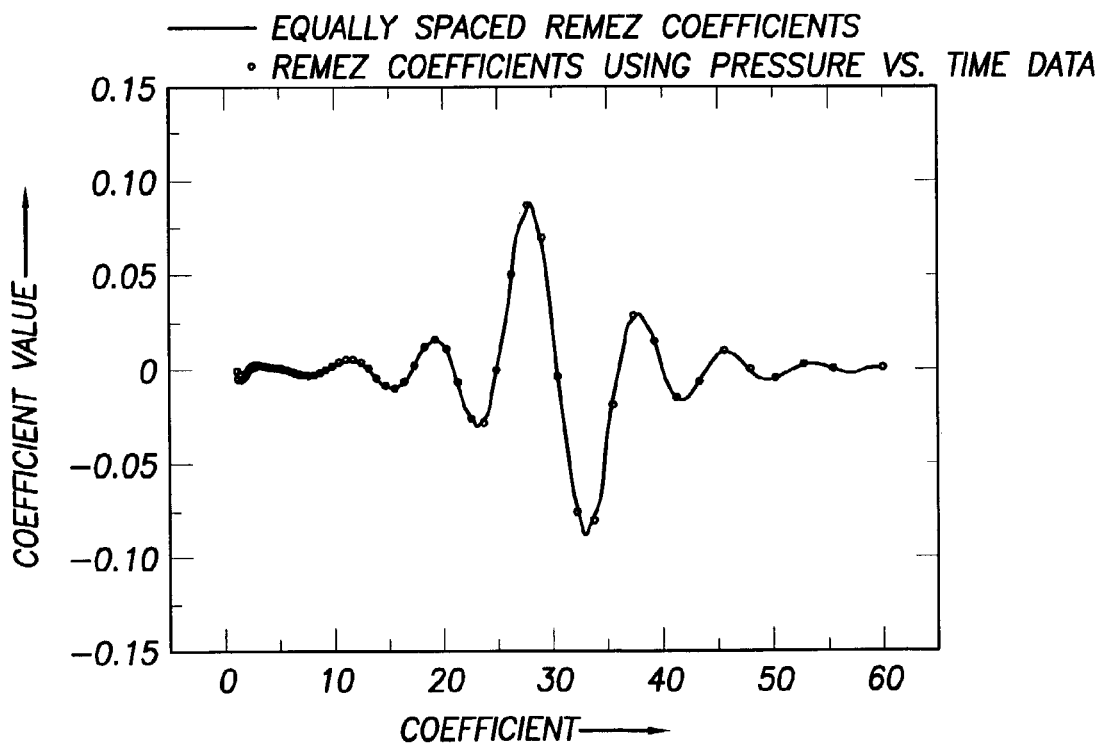

Refer to FIG. 18 for Equally and Logarithmically Spaced Remez Coefficients

This technique is elegant from a signal processing viewpoint and produces reliable results when the data is not too irregularly sampled; that is, when large variances do not occur between the samples. However, this approach requires that a new set of N coefficients be computed for each pressure point, p(i), using the previous N/2 points and the following (N/2)−1 points as input to the polynomial equation. The result is the algorithm is too time consuming for interactive interpretation. For the general case, we have found that simply extending Eq. 52 by using the appropriate time difference produces very accurate results. That is, $$DPDT(i) = \frac{DPDT(i)}{\Delta t_i - \Delta t_{i-1}} \quad (53)$$

This approach is more tractable from an implementation point of view, is much more efficient and is applicable regardless of the data sampling scheme. We will use this approach when computing the examples given in Section 3.5.

3.3 Incorporation of Various Time Functions

Originally, the pressure derivative of Bourdet et al. was simply $dp/d\Delta t$. This is the simplest of derivatives to perform, it makes sense intuitively and it is mathematically satisfying since the $dp/d\Delta t$ term appears directly in the diffusivity equation for transient flow. The logarithmic solution to the diffusivity equation however, suggests taking the derivative $dp/d\ln(\Delta t)$ or $(dp/d\Delta t)(\Delta t)$. This modification has the advantage of producing recognizable, distinctive slopes when plotted on logarithmic grid. Recently, it has apparently become popular (judging from the extensive use in commercial software) to differentiate with respect to the characteristic time function of the flow regime under question. For example, it is easier to visually identify a slope of zero than a slope of, say, one quarter. To identify bi-linear flow in a fractured well dataset, we could therefore take the derivative $dp/d\Delta t^{0.25}$ to produce a horizontal trend during the bi-linear flow regime. Similarly, the derivatives $dp/d\Delta t^{0.5}$ and $dp/d\Delta t^{-0.5}$ will produce zero slope trends for linear and spherical flow regimes, respectively. Any other flow regime of interest may be discerned by taking the appropriate derivative function. Common flow regimes and their characteristic derivative responses are shown below in FIG. 19.

Figure 19:
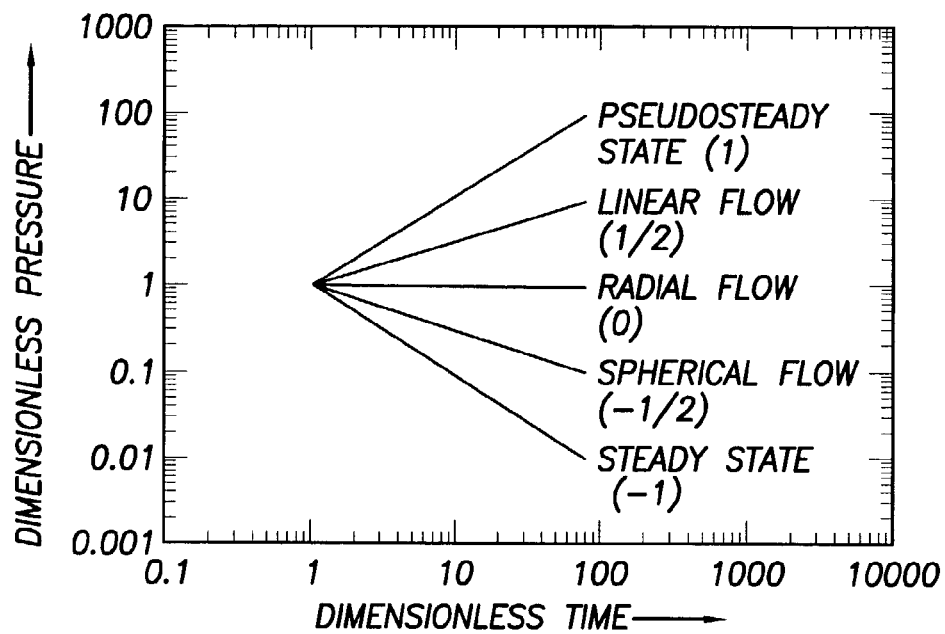

Refer to FIG. 19 for Common Flow Regimes

The final time function we must consider, and perhaps the most important, is the superposition time function. This time transform accounts for the effects of flow periods prior to that being analyzed and is applicable for situations in which the reservoir behavior is constant from one transient to the next; that is, linear systems. Most situations encountered in well testing adhere to this constraint of linearity. An example of a non-linear situation is the injection-falloff sequence during injection well testing. Obviously, the injected fluid front will not be stationary during injection periods and thus, strictly speaking, the use of superposition techniques to provide for variable rate analysis will not be valid. It has been shown however,[53] that the non-linearity resulting from the front movement from one period to the next is sufficiently weak that conventional analysis techniques (superposition) remain applicable.

From an interpretation standpoint, we must incorporate the superposition function in the DPDT to provide variable rate analysis in a general manner so that all situations may be handled. This should be accomplished in a manner that utilizes the established techniques of superposition analysis already present in well test analysis software.

From the superposition principle[54], for $\Delta t=t-t_n$ and given a series of n step changes in the surface flowrate, $\Delta q_j=(q_{j+1}-q_j)$, for j=1, . . . , n, with $q_0=0$, the downhole pressure is given by $$p_{wf}(\Delta t) = \sum_{j=0}^{n} (q_{j+1} - q_j) \log(t_n - t_j + \Delta t) \quad (54)$$

Here, the log term indicates that $\Delta t$ is long enough to see infinite acting radial flow. Taking the derivative with respect to the superposition time function (given by the right-hand side of Eq. 54) has the advantage of incorporating the previous flow history into the analysis procedure and has become the endorsed practice in well test analysis[15]. Traditionally, to facilitate parameter computation, we use the normalized superposition function, given as $$NSF = \frac{2.3026 * \sum_{j=0}^{n} (q_{j+1} - q_j) \log(t_n - t_j + \Delta t)}{q_n - q_{n-1}} \quad (55)$$

We can include the time functions $dp/d\ln(\Delta t)$, $dp/d\Delta t^{0.25}$, $dp/d\Delta t^{0.5}$, etc. using simple techniques. For radial flow ($dp/d\ln(\Delta t)$), we have the Digital Pressure Derivative, $dp/d\Delta t$, multiplied by $\Delta t$. For linear flow ($dp/d\Delta t^{0.5}$), we have $dp/d\Delta t * 2\sqrt{t}$ and for bi-linear flow ($dp/d\Delta t^{0.25}$), we have the $dp/d\Delta t * 4t^{3/4}$. Similarly, the spherical derivative becomes $dp/d\Delta t * -2t^{-3/2}$. To incorporate the superposition time function into the Digital Pressure Derivative Technique we use the chain rule and compute $(dp/d\Delta t)/(dNSF/d\Delta t)$. This can either be done numerically, by computing the superposition time function as normal and numerically computing the derivative, or, by computing beforehand the function (dNSF/d$\Delta t$) given by $$\frac{dNSF}{d\Delta t} = \frac{2.3026 * \sum_{j=0}^{n} (q_{j+1} - q_j) / [2.3026(t_n - t_j + \Delta t)]}{q_n - q_{n-1}} \quad (56)$$

We suggest using the latter.

This procedure also applies for other time transforms such as the pseudotime function given by Agarwal, et al.[55] and the equivalent time concept.

3.4 Sensitivity Analysis

The important parameters in a digital differentiator are its length, N, its band-edge (cutoff) frequency, $f_c$, and the resulting error $\delta$ of the approximation (approximate versus ideal derivative). The interrelationship among these three parameters is shown parametrically below in FIG. 16 and FIG. 17. The error in decibels versus the cutoff frequency with N as a z parameter is shown in FIG. 16 for N even and in FIG. 17 for N odd. The figures basically show that comparable-length differentiators with N even are always better in the sense that the maximum approximation error is smaller.

Figure 20:
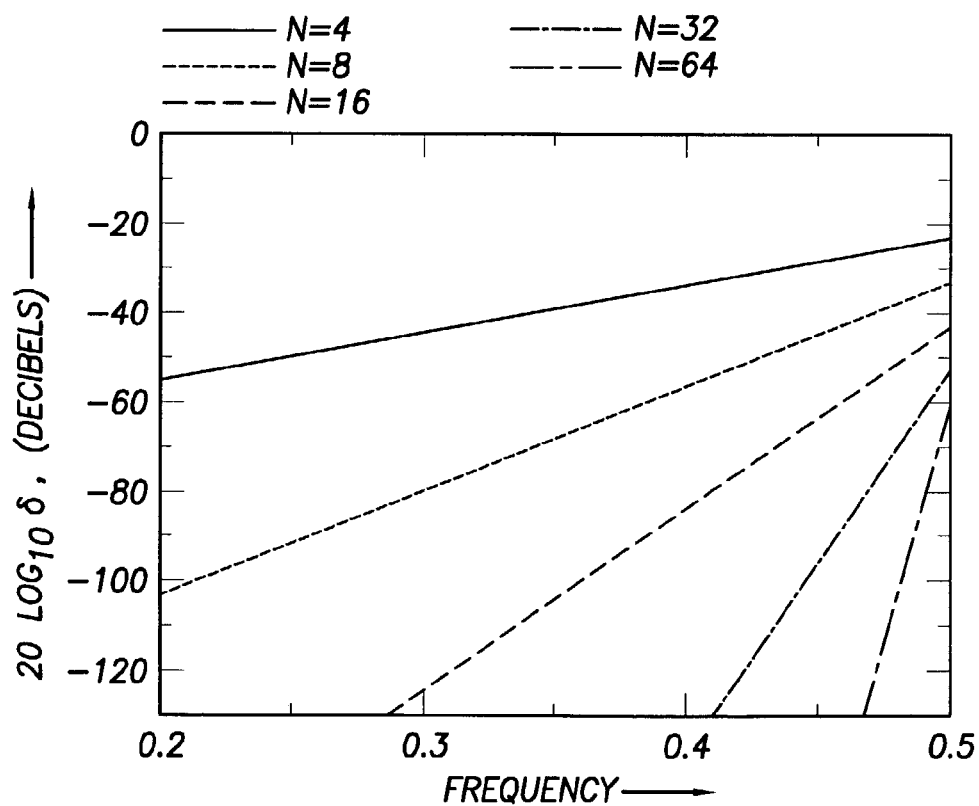

Refer to FIG. 20.

Figure 21:
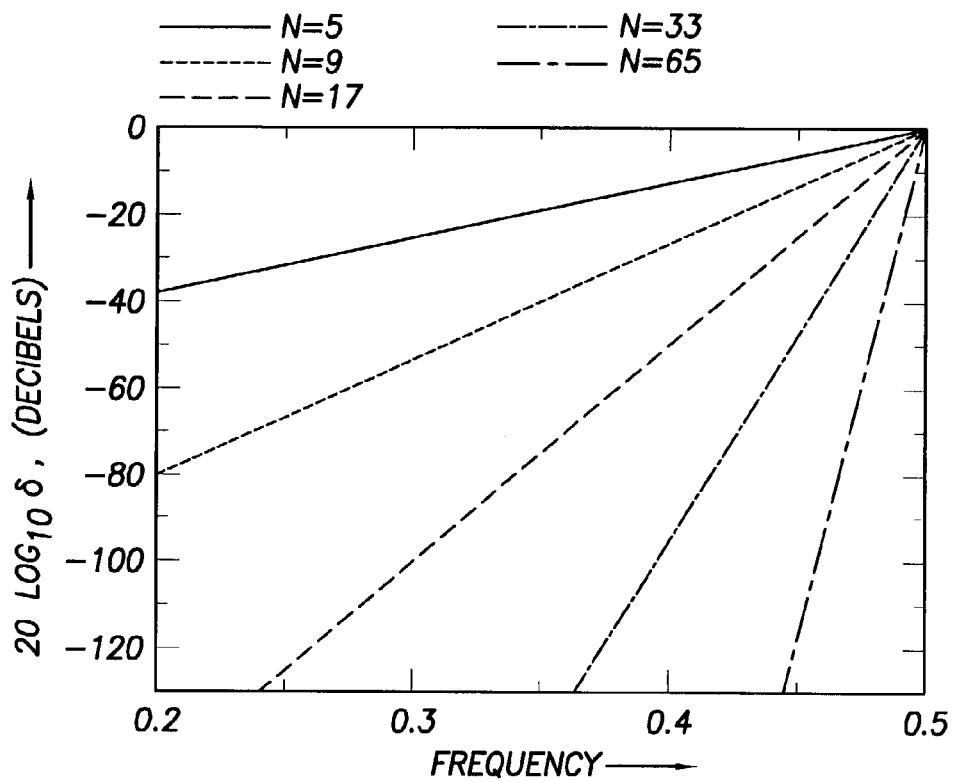

Refer to FIG. 21.

An important practical consideration when choosing N is the unavoidable N/2 lag in the convolution operation as given by Eq. 15. That is, we must wait for N/2 pressure samples before we can compute the first derivative point. Furthermore, we are constrained by Eq. 15 to stop computing the derivative at N/2 points before the last pressure sample. The optimum choice for N is therefore the smallest value for which an acceptable approximation error can be obtained. An empirical formula for the prediction of N, in terms of the acceptable error is given by Herrmann et al.[64] as $$N = Int\left[\frac{(D - FB^2)}{B} + 1.5\right] \quad (57)$$

where $$B = 1/2\pi \quad (58)$$

$$D = [0.005309(\log \delta)^2 + 0.07114 \log \delta - 0.4761] \log \delta \quad (59)$$

and $$F = (0.51244 \log \delta) + 11.012 \quad (60)$$

Figure 22:
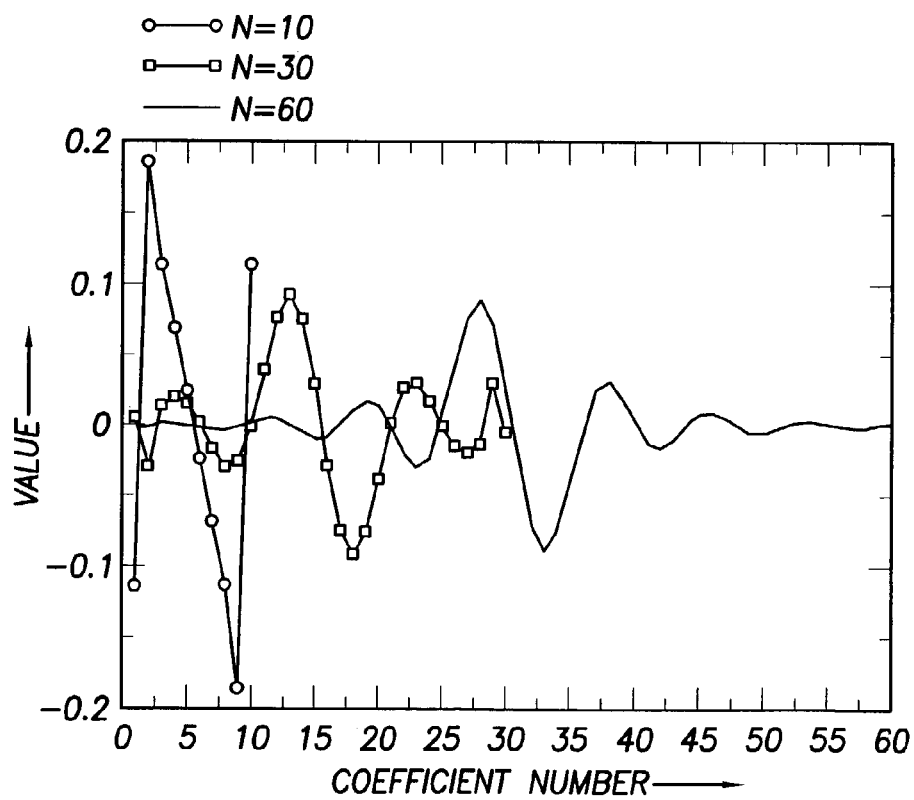

To demonstrate the sensitivity of the derivative response to the value of N, we use the Remez algorithm to generate three wavelets of lengths N=10, 30 and 60 coefficients. A cutoff frequency, $f_c$, of 0.1 was used in the Remez algorithm. FIG. 22 presents the three wavelets, followed by FIG. 23, which illustrates the frequency responses computed using Eq. 12. Here, it is evident that a longer filter will produce a more accurate ideal differentiator as the N=60 wavelet has the smoothest frequency response from 0 to $f_c$. As we expect, the magnitude is proportional to the frequency. Furthermore, the longer wavelets exhibit a smoother behavior following the passband frequency (f=0.15).

Refer to FIG. 22 for Coefficient Wavelets for Three Different Filter Lengths

Figure 23:
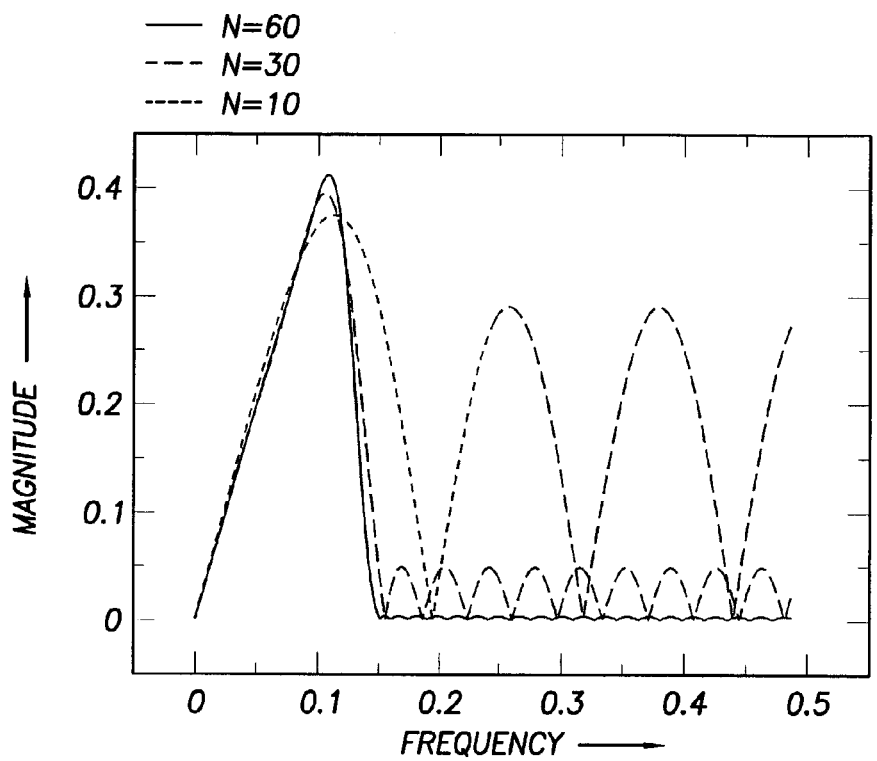

Refer to FIG. 23 for a Frequency Response for Three Coefficient Wavelets

Figure 24:
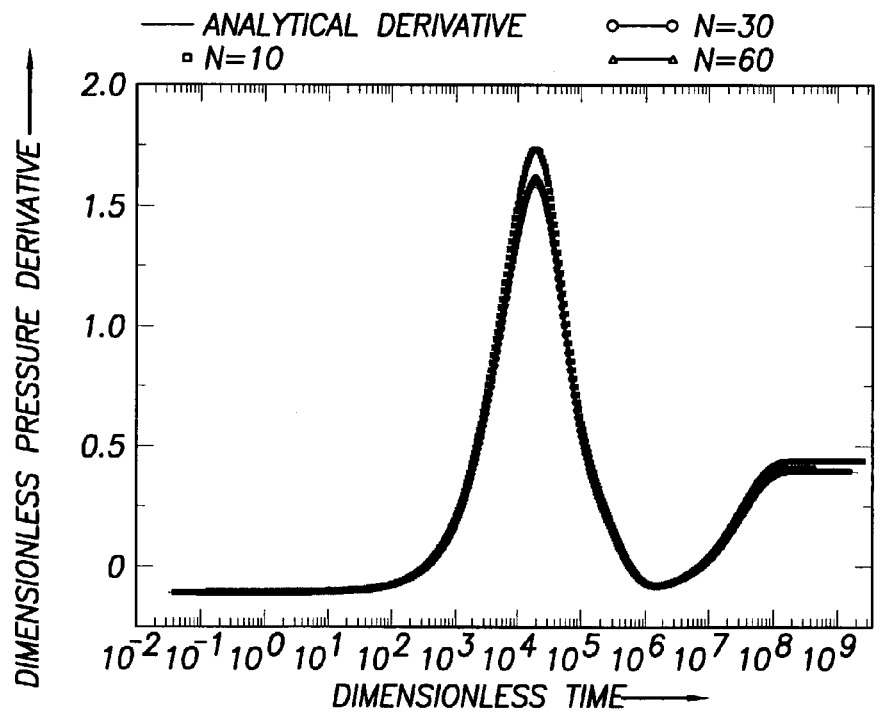

FIG. 24 presents the derivative responses computed using the wavelets described above. The pressure response of a fully penetrating well in an infinite, two-porosity reservoir was computed using Eqs. 42 and 43. The solid line represents the derivative computed analytically in the Laplace domain. Note there is very little difference between the N=30 and N=60 cases. In practice, this almost insignificant difference would hardly justify using a filter length of 60 (or longer) given the N/2 lag in computing the derivative points.

Refer to FIG. 24 for DPDT Responses for Three Different Filter Lengths

We now turn our attention to the sensitivity of the cutoff frequency, $f_c$. The cutoff frequency may be described as that frequency, above which, only the non-reservoir signal (noise) is available. We have seen from Section 2.10 that $f_c$ is independent, for all practical purposes, of the reservoir model being considered. We expect however, that the cutoff frequency be very dependent on the quality of the measured data. For example, if the quality was poor, say, a signal to noise ratio of one, we would expect $f_c$ to be low in order to filter the significant noise contribution. On the other hand, for very high signal to noise ratios, we can choose $f_c$ conservatively high in order to retain as much reservoir signal as possible. As an aside, if we know the signal to noise ratio of our pressure measurement, we can find the optimal value of $f_c$ algorithmically as follows:

1. Compute the power spectral density as described in Section 2.10
2. Integrate the area under the PSD curve from a frequency of 0 to Nyquist
3. The frequency at which the cumulative area equals the signal to noise ratio is the value of the cutoff frequency.

Figure 25:
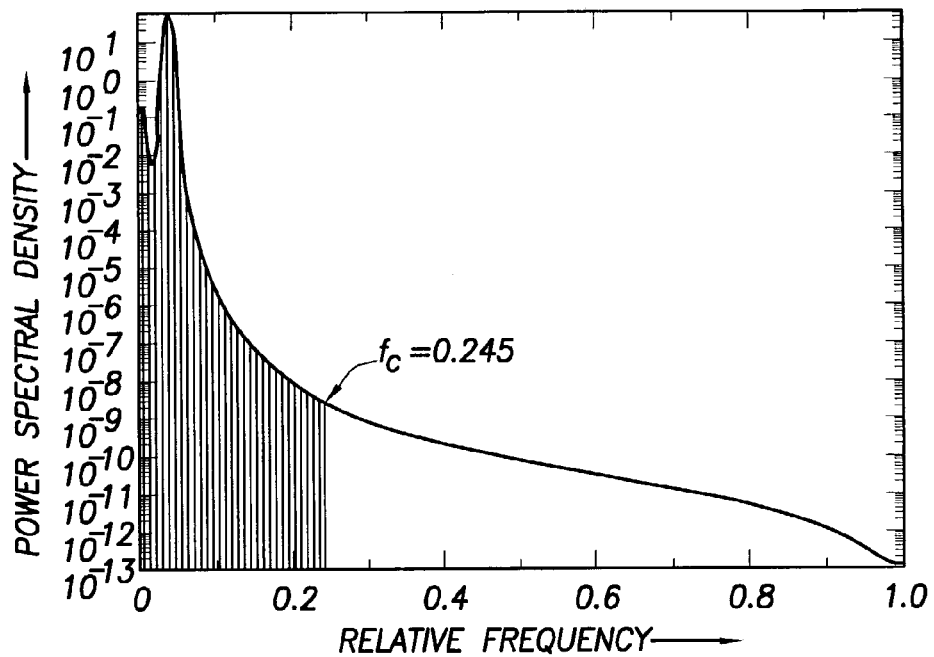

This is illustrated in FIG. 25 for a signal to noise ratio of one. At a relative frequency of 0.245, the area shaded is equal to one-half the total area under the curve. Stated differently, because the total response (signal plus noise) is represented under the PSD curve, and the signal and noise contributions are equal (unit signal to noise ratio), the cutoff frequency between the signal and the noise is $f_c=0.245$.

Refer to FIG. 25 for a Determination of $f_c$ for a Unit Signal-to-Noise Ratio

To illustrate the sensitivity of $f_c$, we again use the example of a finite radius well completely penetrating a two-porosity, homogeneous reservoir. We compute the dimensionless pressure response and add two percent random (white) noise as follows:

$$\text{Signal} = p_D(t) + 0.02\text{rand}(t) \quad (61)$$

Figure 26:
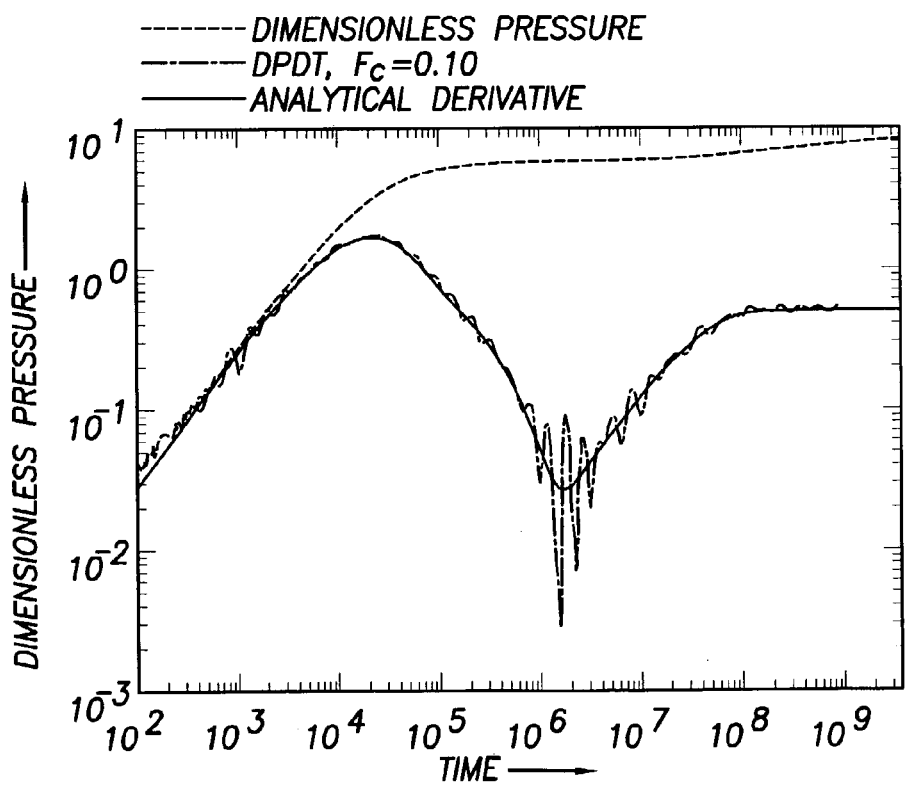

The signal and the analytical derivative are plotted in FIG. 26 along with the DPDT computed with a cutoff frequency, $f_c$, of 0.10. The analytical derivative was computed using the actual $\bar{p}_D$, without noise, to represent the ideal response. The DPDT follows the analytical derivative fairly well except in the transition region from fissure flow to total system flow.

Refer to FIG. 26.

Figure 27:
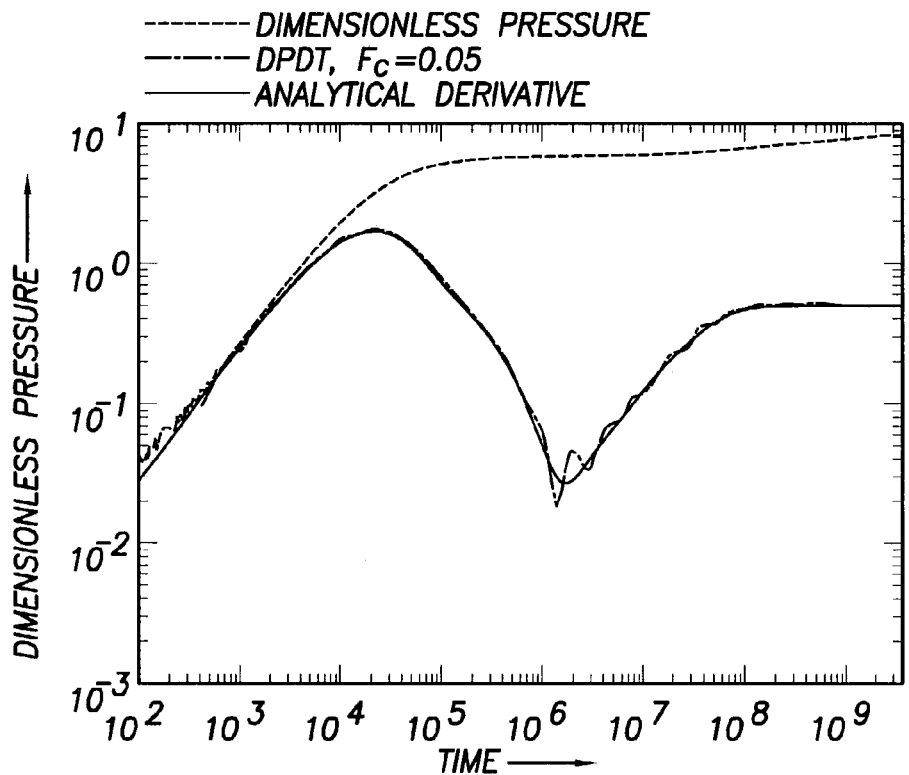

FIG. 27 presents the DPDT using $f_c=0.05$. Here, the DPDT agrees much more closely with the analytical derivative overall, but is again in error during the transition phase.

Refer to FIG. 27.

Finally, we compute the DPDT using $f_c=0.025$. The result, shown in FIG. 28, agrees very well with the analytical derivative. A value of $f_c$ in this range was expected in this example because the signal-to-noise ratio was fairly high. Finally, we compare the conventional, 3-pt. central difference of computing dp/dt with the analytical derivative. This comparison is shown in FIG. 29. The derivative was computed using no smoothing (L=0). The advantage of using the DPDT is obvious.

Figure 28:
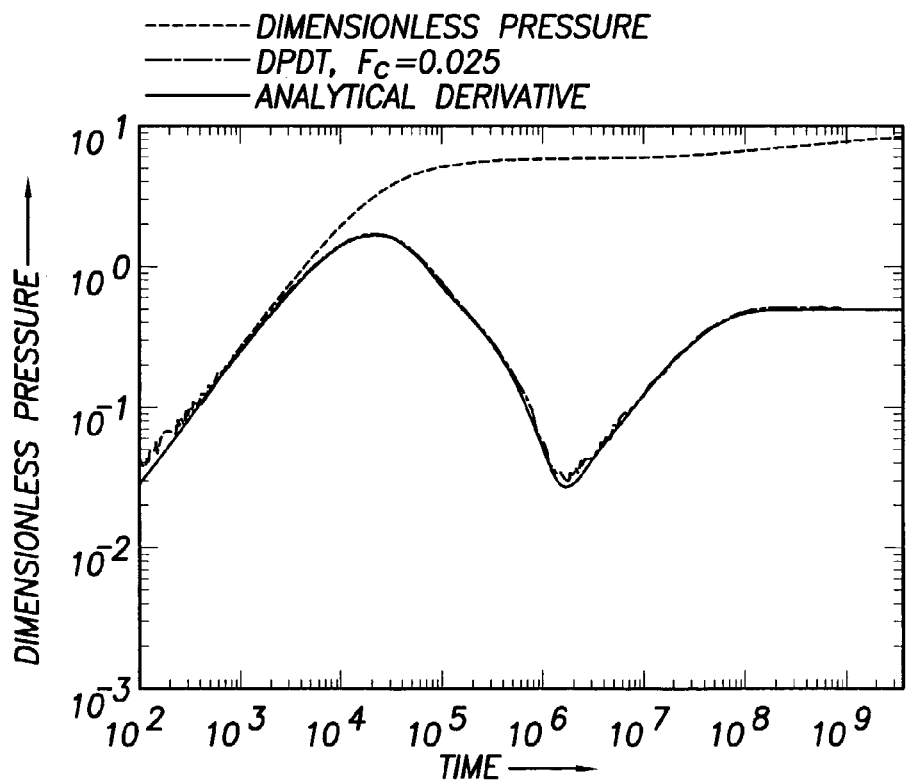
Figure 29:
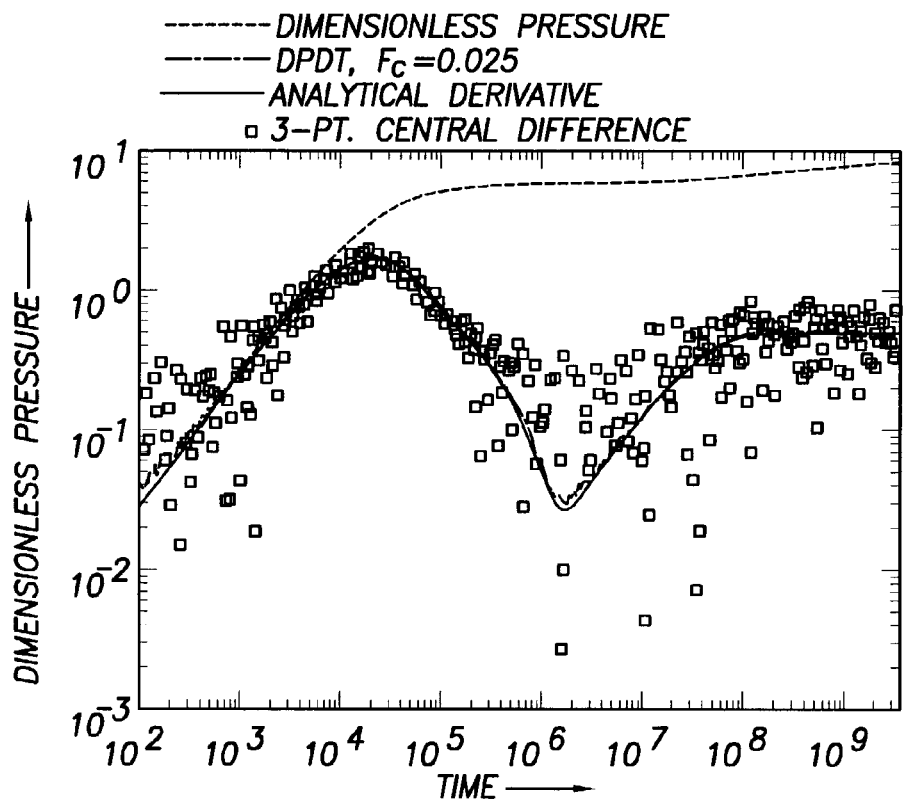

Refer to FIG. 28.

Refer to FIG. 29.

We note here the importance of using the same differentiation algorithm for both the measured data and the analytical solution (type curve) when interpreting transient data.

While the analytical derivative may be computed simply and efficiently using Laplace transform theory, consistency between computing the measured and model derivative is imperative.

3.5 EXAMPLES

Figure 30:
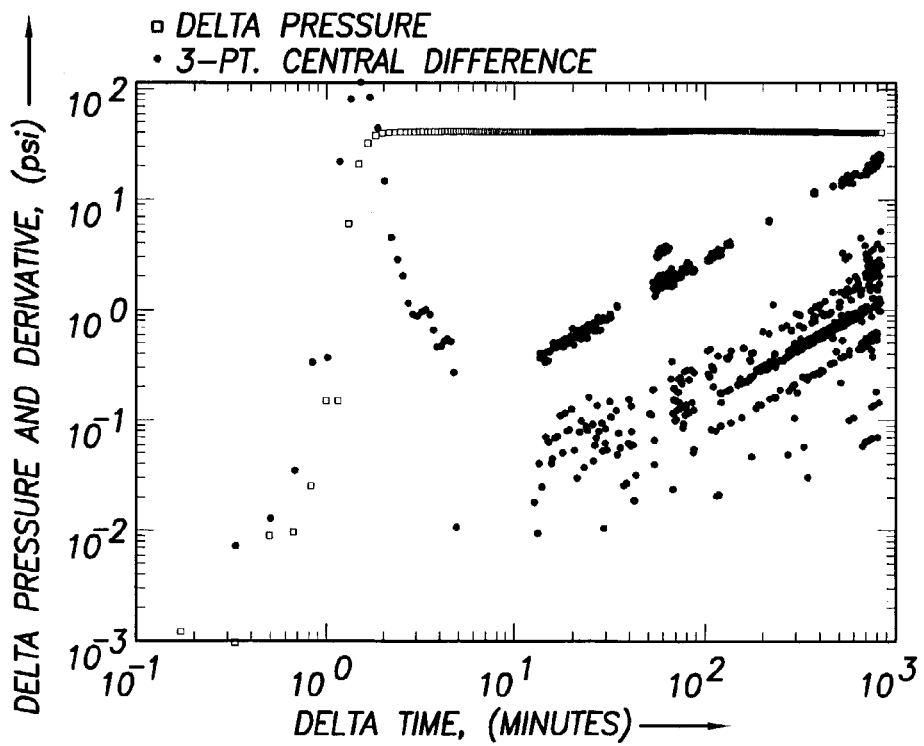
Figure 31:
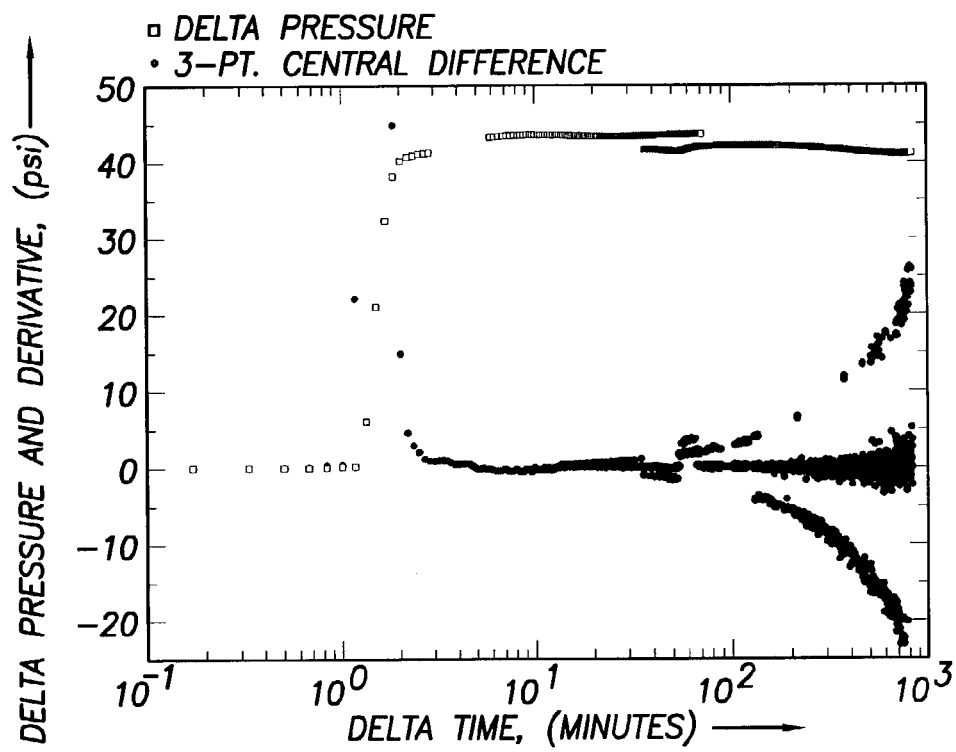

We now illustrate the efficacy of the DPDT by considering two example datasets. The first, illustrated in FIG. 30, is a drawdown from a gas well in the Gulf of Mexico. The derivative shown was computed using the conventional three-point central difference method with zero smoothing. The parallel, unit-slope lines indicate that the pressures being measured are changing in increments less than the resolution of the pressure gauge. To better illustrate this behavior, a semi-log plot is shown in FIG. 31. Here, because the negative values can be shown as well, the phenomenon of measuring below the resolution of the gauge is more apparent. For each sample, the actual value of pressure is either one bit above, or one bit below what the gauge is capable of measuring. Statistically, when enough samples are taken, roughly half of the measured values will be too high and half will be too low. This phenomenon often goes unnoticed in practice and, worse, is often the cause of incorrect interpretations; falsely interpreting this behavior as reservoir boundaries, for example.

Refer to FIG. 30 for a Log-log plot of Delta Pressure and derivative for Example 1.

Refer to FIG. 31 for a Semi-log Plot of Delta Pressure and derivative for Example 1.

Figure 32:
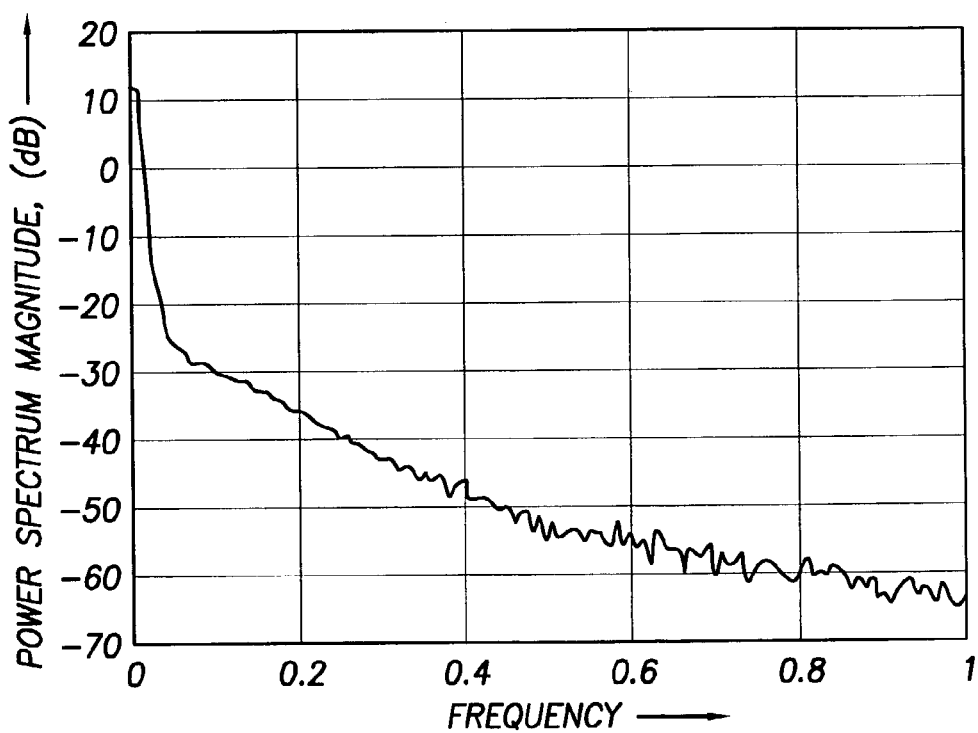

To compute the DPDT for this example, we first examine the power spectral density presented in FIG. 32. The majority of the signal's energy is below a frequency of roughly 0.05 that of the Nyquist frequency; that is, the signal to noise ratio is very small. Using $f_c$=0.05 and a default value of 60 for the filter length, we obtain the derivative shown in FIG. 33. The DPDT, while showing some instability at the end of the transient, is clearly better behaved than the conventional approach. There are negative values in the DPDT as well due to the pressure change decreasing. This example is a good illustration that little can be done if the original signal to noise ratio is very small. This is often the case in very high permeability reservoirs or situations in which an incorrect gauge was used.

Refer to FIG. 32 Illustrating a Power Spectral Density for Example 1.

Figure 33:
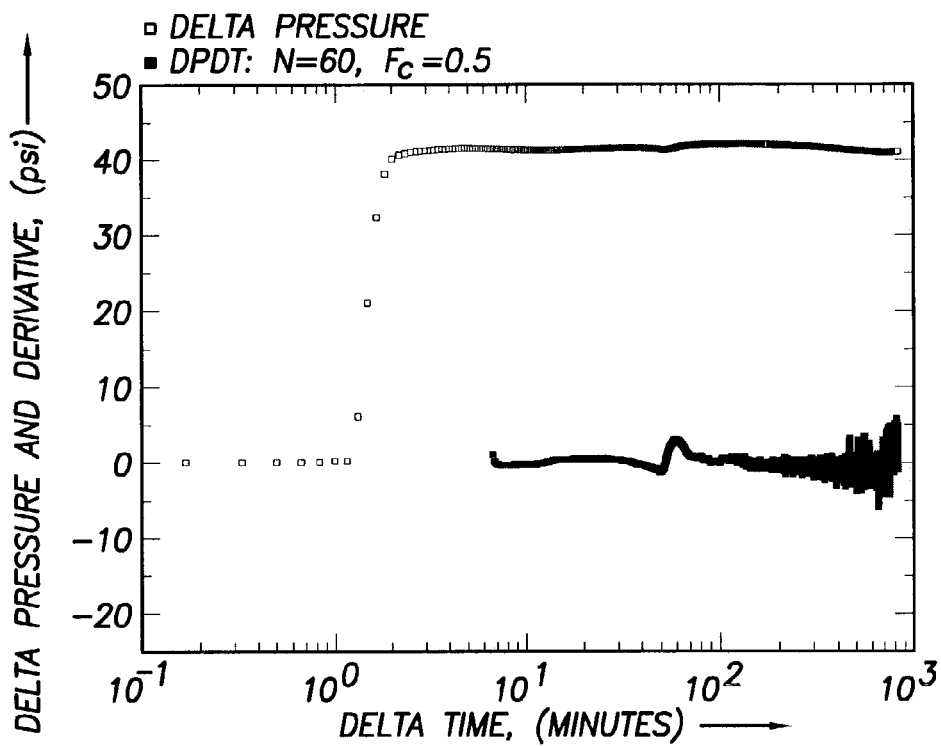

Refer to FIG. 33 Illustrating the DPDT for Example 1.

Figure 34:
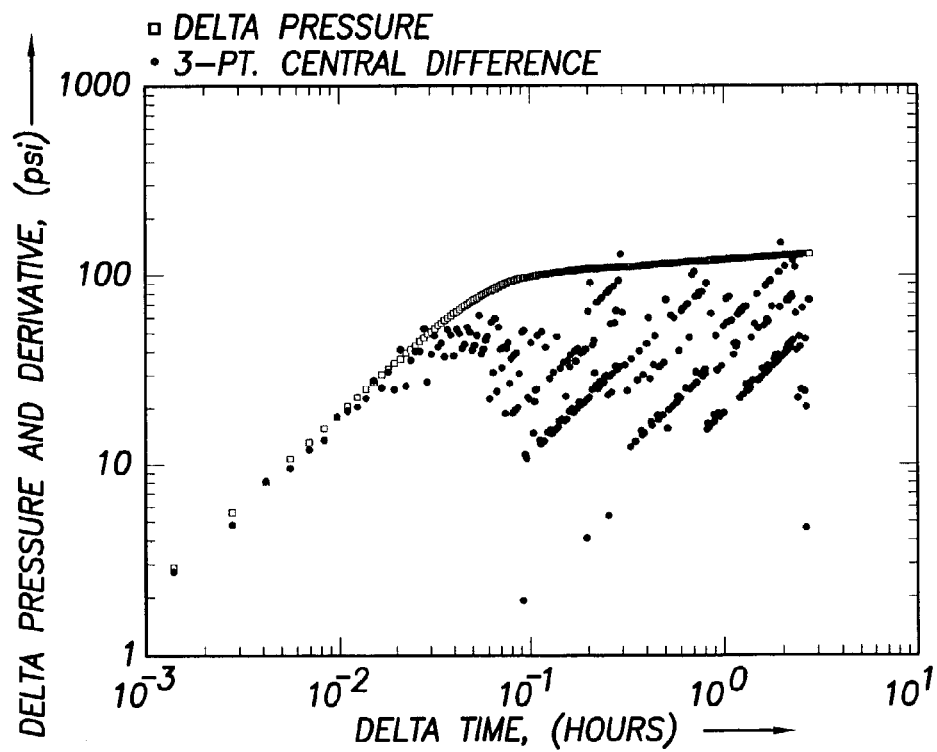

The second example is a buildup period consisting of roughly three hours of data. The pressure change and the conventional pressure derivative are shown in FIG. 34. The derivative shown here was computed using zero smoothing. Again, we see the parallel, unit-slope lines typical of resolution problems. As in the first example, this is better illustrated in the semi-log plot in FIG. 35.

Refer to FIG. 34.

Figure 35:
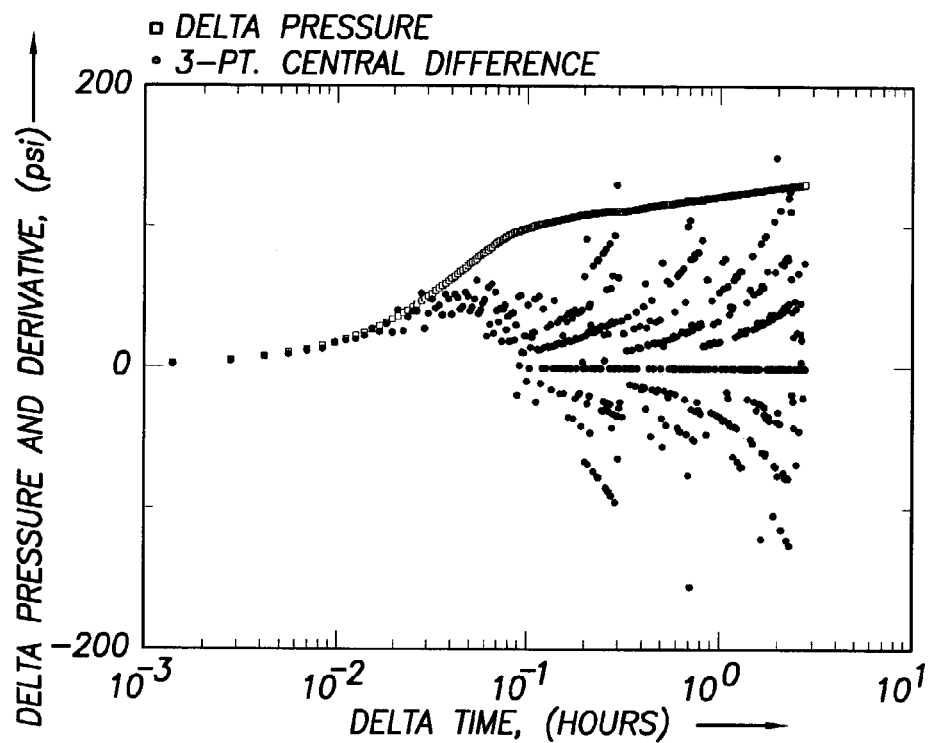

Refer to FIG. 35.

In this example, unlike the previous, the pressure change increases during the entire transient at an appreciable rate. Unless a very low-resolution gauge was used, the noisy derivative could be a result of other factors, including the differentiation process itself. Here, we compute the DPDT using a shorter filter length (N=40) and a larger cutoff frequency ($f_c$=0.12). This value of $f_c$ was obtained by examining the power spectral density, shown below in FIG. 36. At a normalized frequency of roughly 0.12, the energy of the pressure signal diminishes to what appears to be the noise floor. The resulting derivative is shown in FIG. 37. The DPDT in this example allows the analyst to diagnose the reservoir behavior and to estimate reservoir properties based on the horizontal portion of the derivative.

Figure 36:
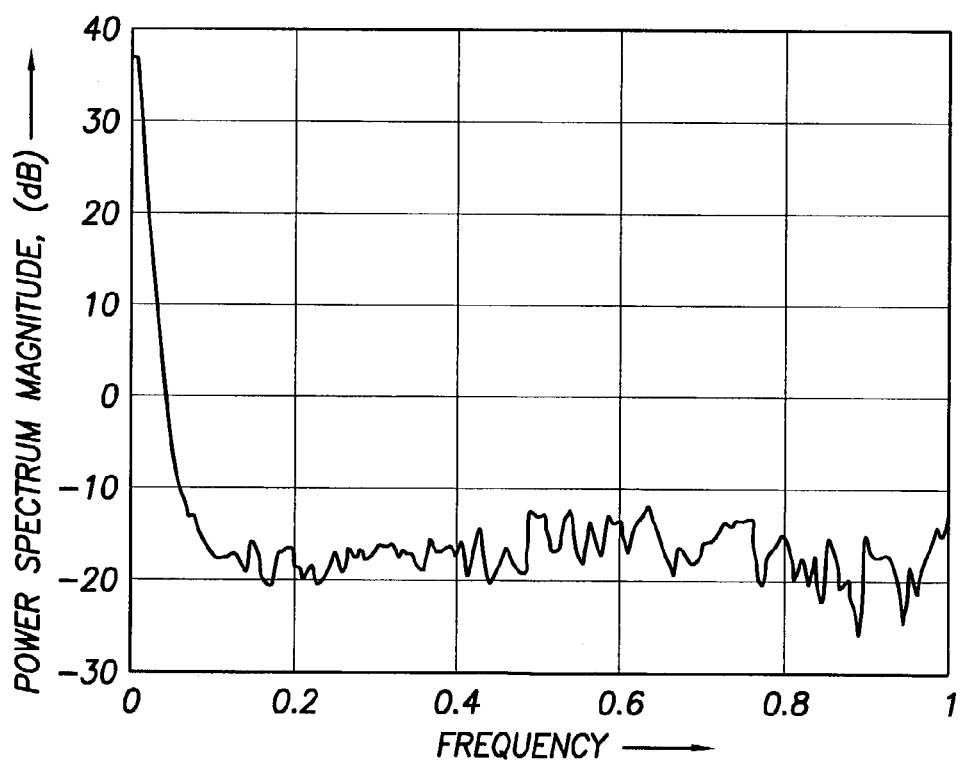

Refer to FIG. 36 for a Power Spectral density for Example 2.

Refer to FIG. 37 for a DPDT for Example 2

We note here that in the examples above we have compared a "smoothed" derivative, the DPDT, with the conventional derivative using no smoothing. A valid question at this point is "What value of smoothing, L, does the conventional three-point central difference technique require to produce the same quality derivative trace as the DPDT?" The answer depends on both the sampling frequency and the frequency spectrum of the measured pressure.

Refer to FIG. 38 for a Comparison of DPDT with Conventional Derivative, L=0.09.

The intention of analysts when interpreting noisy data using conventional techniques is to apply the maximum amount of smoothing, say, $L_{max}$, without altering the actual reservoir signal. Traditionally, this has been done blindly; the value of $L_{max}$ being unknown. The work described here allows us to quantify $L_{max}$ by making comparisons of central-difference derivatives with the DPDT computed using the frequency cutoff between reservoir signal and non-reservoir signal. In FIG. 38, we present the DPDT (as computed above) with the conventional three-point central-difference derivative technique using a smoothing parameter L, of 0.09. The two derivative traces overlay each other very closely, suggesting that this is the maximum value of L, which may be used without altering the reservoir signal itself. We feel that this is a major contribution of the work presented here; that we may now quantify the heretofore subjective choice of the optimal smoothing value, $L_{max}$. To illustrate the danger of oversmoothing, we show in FIG. 39 the result of several different values of L.

Figure 39:
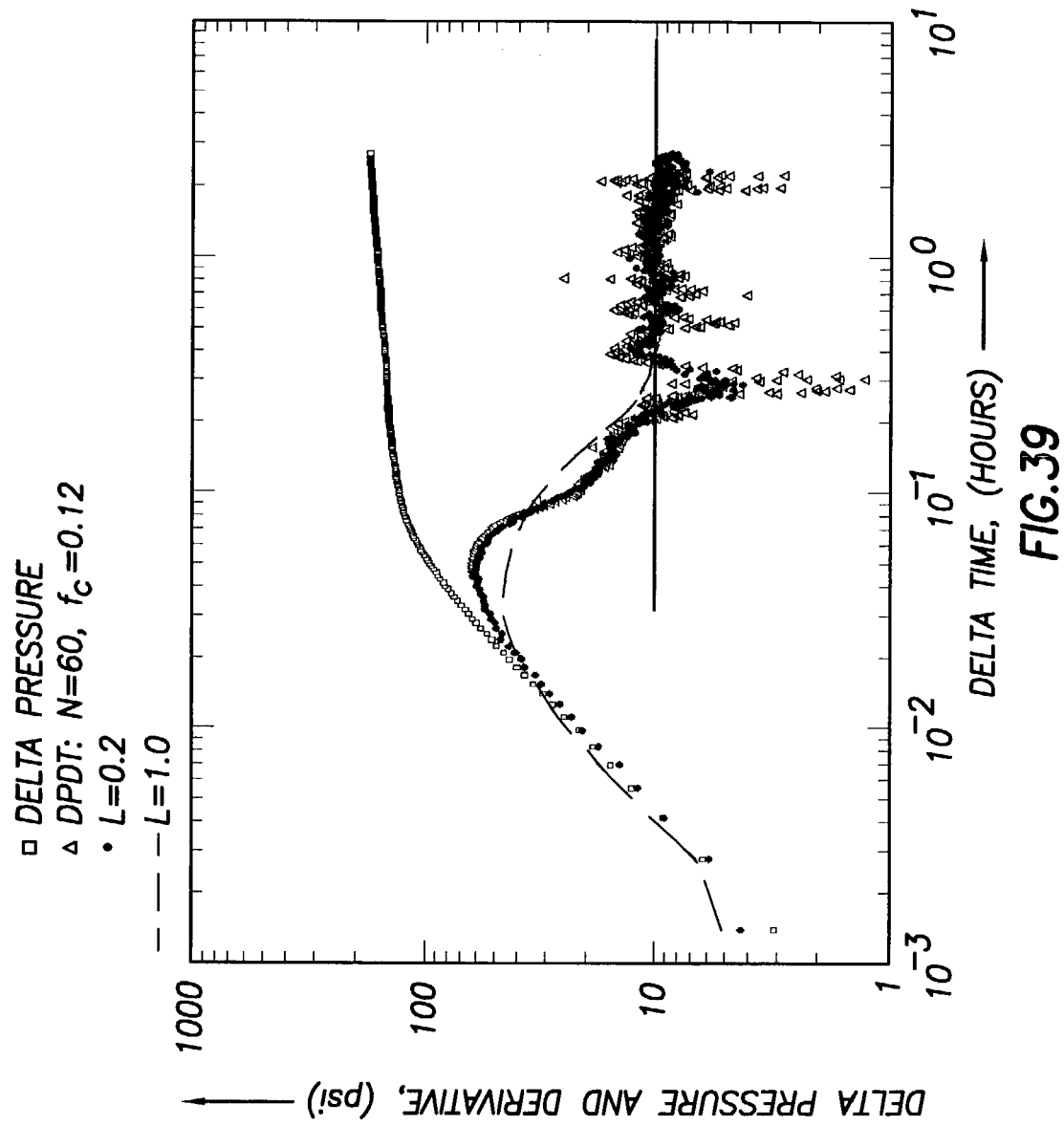

Refer to FIG. 39.

3.6 Software Implementation

The techniques described in the previous sections were implemented in FORTRAN and incorporated in a Microsoft Windows™ application. This application was used to compute the examples given in the previous section. The algorithms for computing the power spectral density and discrete convolution are performed in dynamic linkable libraries (DLL's). The advantage of this is that the user interface remains independent enabling portability between different operating systems (e.g. Windows™, Windows NT™, AIX™, Unix™).

The human interface of the application is shown below. The DPDT option may simply be appended to any existing derivative methods in the well test analysis software (i.e. two-point, three-point forward, central and backward finite difference methods). The inputs to the computation, as we have discussed, are the filter length, N, and the cutoff frequency, $f_c$. The filter length can either be entered by the user or computed using the empirical formulas given by Eq. 57. The value of $f_c$ may be manually entered or graphically chosen from a line plot of the power spectrum density. For situations in which the ideal value of $f_c$ is not apparent, a sensitivity mode is available. Here, the user may enter up to five values of $f_c$ and a DPDT will be computed for each of the values. The ideal value can then be determined visually. This option is also useful for comparing the DPDT with conventional, smoothed derivatives, as discussed in Section 3.5.

An additional approach for determining the optimum value of the cutoff frequency has also been implemented in the software but remains experimental at this point. We anticipate this approach will constrain both the minimum and the maximum value of $f_c$ based on our knowledge of pressure transient theory. The technique utilizes an obscure but powerful signal processing concept known as Bernstein's Inequality[59]. This little-known relation can be stated as follows:

If a signal, p(t) has an upper bound, M, on its absolute magnitude over the time interval of interest, that is if $$|p(t)| \leq M \quad (63)$$

and if the signal is also band limited to σ, that is, if P(ω)=0 for ω≧σ, then a bound on the signal derivative's absolute magnitude is given by $$|p'(t)| \leq \sigma M \quad (64)$$

Note that if we can estimate the maximum values of |p'(t)| and |p(t)| then we can solve Eqs. 63 and 64 for σ. This band limit can be used to determine a lower bound for a pressure gauge's sampling rate per second (i.e. $f_{sam} \geq \sigma/\pi$) and the bounds on the cutoff frequency (i.e. $f_{sam} \geq f_c \geq \sigma/2\pi$).

For example, from a pressure transient build-up test, the extrapolated pressure, p*, provides the maximum absolute pressure bound. Therefore, $$f_c \geq |p'(t)|/(\pi p^*) \quad (65)$$

We now must determine the maximum possible value of the pressure derivative, |p'(t)|. Here, |p'(t)| is the derivative with respect to time, either t or Δt. Intuitively, we expect the maximum in the derivative to occur early in the transient when pressure gradients within—and immediately surrounding—the well are at their highest. That is, we expect estimates of wellbore storage and skin to be the principle parameters when estimating the maximum pressure derivative. This is consistent with the process of diffusion; that the rate of pressure change decreases monotonically. We can use estimates of these governing parameters to in turn estimate the maximum value of |p'(t)|.

Alternatively, we can simply compute the derivative once using the conventional three-point central difference method (or any other) to arrive at an approximate maximum value for input to Eq. 65. In the software implementation described here, this method is done iteratively; at each iteration a DPDT is computed using the current estimate of $f_c$. The maximum value of the DPDT is used as input to compute the next value of $f_c$ and the next DPDT.

We close this discussion with a mention of performance. The computational effort required to compute the DPDT is roughly equivalent to conventional finite-difference techniques; computation of the power spectral density and automatic determination of $f_c$ are only slightly more expensive. The main point of this section is to note that the DPDT may be easily implemented in existing well-testing software.

Figure 40:
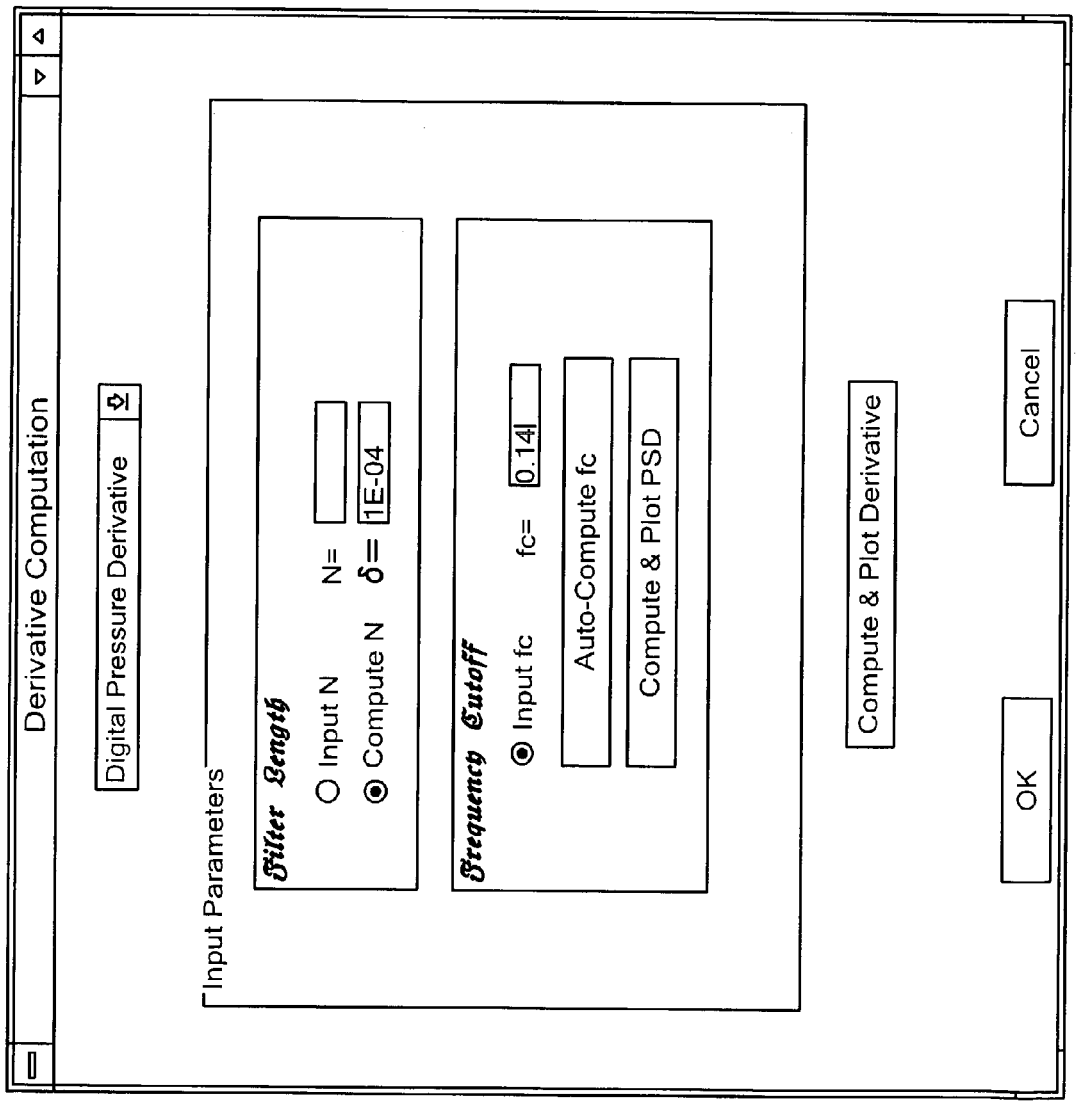

Refer to FIG. 40 Illustrating an Input Window for DPDT Parameters.

4. Conclusions

In this specification, we have presented a new method of computing the derivative of pressure transient data. The method combines several fundamental concepts from the signal processing literature with our knowledge of the measurement system to separate the acquired well test data into reservoir- and non-reservoir behavior. The result is a more reliable derivative trace, which gives the analyst a higher degree of confidence when diagnosing the reservoir behavior and identifying flow regimes for parameter estimation. The examples provided herein have demonstrated the efficacy of the new technique. In addition, the following benefits of the DPDT may be realized:

The DPDT provides a physical feeling for the degree of derivative smoothing; unlike the subjective approach used today in conventional derivative algorithms.

The DPDT is amenable to automatic type-curve matching, particularly those techniques based on pattern recognition, due to the reduced scatter of the derivative points.

The DPDT may be used in either real-time, as data is acquired, or it may be implemented in the firmware of recorder gauges. In the latter case, the DPDT can optimize the duration of each transient based on a programmed minimum signal-to-noise ratio.

Additional Digital Signal Processing techniques such as oversampling may be utilized to further enhance the pressure derivative using the DPDT.

Transient analysis techniques that utilize higher-order derivatives have been developed but rarely used due to insufficient stability in the final derivative. An example is given by Cinco-Ley, et al.[57] in which the second derivative of pressure, $\partial^2 \Delta p/\partial t^2$, is employed to determine reservoir properties using the instantaneous source approach. Other attempts have been made to use higher-order derivatives to facilitate the recognition of various flow regimes.[58]

By simply viewing pressure transient data in the frequency domain, and knowing the physical limits of reservoir frequency response, we can establish limits on which data points may be considered reservoir response and those which may be considered noise. These limits may be presented on the traditional log-log plot as confidence intervals to facilitate the identification of flow regimes and to improve the parameter estimation process using both straight-line techniques and automatic type-curve matching techniques.

| Nomenclature | |
|---|---|
| $C_D$ | dimensionless wellbore storage coefficient |
| $f_c$ | cutoff frequency, radians/second or Hz. |
| $f_{max}$ | maximum frequency, radians/second or Hz. |
| $f_N$ | Nyquist frequency, radians/second or Hz. |
| f(s) | two-porosity function, see text for equations |
| H(z) | digital transfer function |
| h(m) | wavelet coefficient |
| $I_0$ | modified Bessel function of the first kind, zero order |
| $I_1$ | modified Bessel function of the first kind, first order |
| $I_N$ | periodogram estimate |
| j | imaginary number, $\sqrt{-1}$ |
| $K_0$ | modified Bessel function of the third kind, zero order |
| $K_1$ | modified Bessel function of the third kind, first order |
| L | differentiation interval and number of extremal frequencies |
| N | filter length |
| NSF | normalized superposition function, see text for equation |
| p | pressure, psi |
| $p_D$ | dimensionless pressure |
| $p_{wf}$ | bottomhole flowing well pressure, psi |
| q | bottomhole flow rate, Bbl/day or MSCF/day [m³/day] |
| $r_e$ | external radius, ft [m] |
| $r_{eD}$ | dimensionless radius, $r_e/r_w$ |
| $r_w$ | wellbore radius, ft [m] |
| $R_x(\tau)$ | autocorrelation function of τ |
| s | Laplace variable |
| S | skin (total) |
| SF | superposition function, see text for equation |
| Δt | time interval, seconds |
| u | modified Laplace variable |
| z | complex variable |
| Greek | |
| δ | error |
| δ(n) | unit sample |
| λ | interporosity flow coefficient |
| ω | frequency variable or storativity ratio |

REFERENCES

The following references 1–62 are incorporated by reference into the specification of this application.
1. Ozkan, E. and Raghavan, R.: "New Solutions for Well-Test Analysis Problems: Part I, Analytical Considerations," *SPEFE* (September 1991) 359–38. sufficient
2. Ozkan, E. and Raghavan, R.: "New Solutions for Well-Test Analysis Problems: Part II, Analytical Considerations," *SPEFE* (September 1991) 359–38.
3. Ozkan, E. and Raghavan, R.: "New Solutions for Well-Test Analysis Problems: Part III, Analytical Considerations," *SPEFE* (September 1991) 359–38.
4. Houze, O. P., Home, R. N., and Ramey, H. J.: "Pressure-Transient Response of an Infinite-Conductivity Vertical Fracture in a Reservoir with Double-Porosity Behavior," *SPEFE* (September 1988) 510–518.
5. van Everdingen, A. F. and Hurst, W.: "The Application of the Laplace Tranformation to Flow Problems in Reservoirs," Petroleum Transactions of AIME, (December 1949) 305–324.
6. Spath, J., Ozkan, E., and Raghavan, R.: "An Efficient Algorithm for Computation of Wells Producing Commingled Reservoirs," *SPEFE* (June 1994) pp. 115–121.
7. Stehfest, H.: "Numerical Inversion of Laplace Transforms," *Communications of the ACM* (January 1970) 13, No. 1, 47.
8. Schlumberger Technology: "How to Make Well Testing More Cost-Effective," Oilfield Bulletin, February, 1994.
9. Veneruso, T., Ehlig-Economides, and C., Petitjean, L: "Pressure Gauge Specification Considerations in Practical Well Testing," Paper SPE 22752 presented at the 66th Annual Technical Conference and Exhibition of the SPE, Dallas, Tex., Oct. 6–9, 1991.
10. Veneruso, T., Ehlig-Economides, and C., Akmansoy, A. M.:"Computer-Based Downhole Data Acquisition and Transmission in Well Testing," Paper SPE 24728 presented at the 67th Annual Technical Conference and Exhibition of the SPE, Washington, D.C., Oct. 4–7, 1992.
11. Bourdet, D. et al.: "A New Set of Type Curves Simplifies Well Test Analysis," *World Oil* (May 1983) 95–106.
12. Bourdet, D. et al.: "Interpreting Well Tests in Fissured Reservoirs," *World Oil* (October 1983) 77–87.
13. Bourdet, D. et al.: "New Type Curves Aid Analysis of Fissured Zone Well Tests," *World Oil* (April 1984) 111–24
14. Bourdet, D., Ayoub, J. A., and Pirard, Y. M.: "Use of the Pressure Derivative in Well-Test Interpretation," *SPEFE* (June 1989) 293–302.
15. Ehlig-Economides, C., Joseph, J., Ambrose, R., and Norwood, C.:"A Modern Approach to Reservoir Testing," *JPT* (December 1990) 1554–63.
16. Onur, M., Peres, A. M. M., and Reynolds, A. C.: "New Well-Testing Pressure Functions With Applications," *SPEFE* (June 1993) 140–144.
17. Akima, H: "A New Method of Interpolation and Smooth Curve Fitting Based on Local Procedures," *Journal of the Association for Computing Machinery*, Vol. 17, No. 4, October 1970, p.389–402.
18. Proakis, J. G., Manolakis, D. G.: *Digital Signal Processing; Principles, Algorithms, and Applications*, 2nd Ed., Macmillan Publishing Company, 1992.
19. Parks, T. W., Burrus, C. S.: *Digital Filter Design*, John Wiley & Sons, 1987.
20. Bevington, P. R.: *Data Reduction and Error Analysis for the Physical Sciences*, McGraw-Hill Book Company, 1969.
21. Robinson, E. A., Silvia, M. T.: *Digital Signal Processing and Time Series Analysis*, Holden-Day, Inc., 1978.
22. Rabiner, L. R., Schafer, R. W.: *Digital Processing of Speech Signals*, Prentice-Hall, 1978.
23. Claerbout, J. F.: *Fundamentals of Geophysical Data Processing: With Applications to Petroleum Prospecting*, McGraw-Hill Book Company, 1976.
24. Schell, A. C.: *Programs for Digital Signal Processing*, IEEE Press, 1979.
25. Burrus, C. S., Parks, T. W.: *DFT/FFT and Convolution Algorithms: Theory and Implementation*, John Wiley & Sons, 1985.
26. Johnson, J. R.: *Introduction to Digital Signal Processing*, Prentice Hall, 1989.
27. Johnson, D. H., Dudgeon, D. E.: *Array Signal Processing: Concepts and Techniques*, Prentice Hall, 1993.
28. Childers, D., Durling, A.: *Digital Filtering and Signal Processing*, West Publishing Company, 1975.
29. Mesko, A.: *Digital Filtering. Applications in Geophysical Exploration for Oil*, Pitman Publishing, 1984.
30. Beauchamp, K., Yuen, C.: *Digital Methods for Signal Analysis*, George Allen & Unwin, 1979.
31. Antoniou, A.: *Digital Filters: Analysis, Design, and Applications*, 2nd Ed., McGraw-Hill, Inc., 1993.
32. Williams, C. S.: *Designing Digital Filters*, Prentice-Hall, 1986.
33. Bloomfield, P.: *Fourier Analysis of Time Series, An Introduction*, John Wiley & Sons, 1976.
34. Higgens, R. J.: *Digital Signal Processing in VLSI*, Prentice-Hall, 1990.
35. Dutt, A., Rokhlin, V.: "Fast Fourier Transforms for Nonequispaced Data", *SIAM Journal on Scientific Computing*, Volume 14, Number 6, (November 1993), 1368–77.
36. Shah, H., Roy, S. C., Kumar, B.: "On the Design of Efficient Second and Higher Degree FIR Digital Differentiators at the Frequency $\pi/$(any integer)", *Signal Processing*, Volume 27, Number 2, (May 1992), 117–22.
37. Childers, D. G.: *Modern Spectrum Analysis*, IEEE Press, New York, 1978, Chapter II.
38. Herrmann, O., Rabiner, L. R., Chan, D. S. K.: "Practical Design Rules for Optimum Finite Impulse Response Low-Pass Digital Filters," *Bell Syst. Tech. J.*, vol. 52, (July–August 1973), 769–799.
39. Churchill, R. V.: *Operational Mathematics*, 3rd. Ed., McGraw Hill, 1972.
40. Remez, E.: "General Computational Methods of Chebyshev Approximation," Atomic Energy Translation 4491, Kiev, USSR, (1957).
41. Parks and McClellan . . .
42. Bartlett, M. S.: *An Introduction to Stochastic Processes with Special Reference to Methods and Applications*, Cambridge University Pres, Cambridge, 1953.
43. Blackman, R. B., and Tukey, J. W.: The Measurement of Power Spectra from the Point of View of Communciations Engineering, Dover, N.Y., 1958.
44. Grenander, U., and Rosenblatt, M.: *Statistical Analysis of Stationary Time Series*, John Wiley, New York, 1957.
45. Hannan, E. J.: *Muliple Time Series*, John Wiley, New York, 1970.
46. Jenkins, G. M. and Watts, D. G.: *Spectral Analysis and its Applications*, Holden-Day, San Francisco, 1968.
47. Koopmanns, L. H.: *The Spectral Analysis of Time Series*, Academic Press, New York, 1974.
48. Press, Flannery, Teukolsky, Vettering: *Numerical Recipes, The Art of Scientific Computing*, 2nd Ed., Cambridge Press, 1992.

49. Welch, P. D.: "The Use of Fast Fourier Transform for the Estimation of Power Spectra: A Method Based on Time Averaging over Short Modified Periodograms," *IEEE Trans. Audio and Electroacoustics*, vol. AU-15, pp. 70–73, June, 1967.
50. Matthews, C. S., and Russell, D. G.: Pressure Buildup and Flow Tests In Wells, Monograph Volume 1, Society of Petroleum Engineers of AIME, 1967.
51. Lomb, N. R.: *Astrophysics and Space Science*, vol. 39, 1976, 447–462.
52. Scargle, J D.: *Astrophysical Journal*, vol. 263, 1982, 835–853.
53. Ramakrishnan, T. S., Kuchuk, F.: "Transient Testing in Injection Wells: Constant Rate Solutions and Convolution", Schlumberger Internal Report, March 1989.
54. Odeh, A., and Jones, L. G.: "Pressure Drawdown Analysis, Variable Rate Case," *Jour. Pet. Tech.* (August 1985) 960–964.
55. Agarwal, R. G., Al-Hussainy, R., and Ramey, H. J., Jr.: "An Investigation of Wellbore Storage and Skin Effect in Unsteady Liquid Flow: I. Analytical Treatment," *Soc. Pet. Eng. J.* (September 1970) 279–290
56. Clark, D. G. and van Golf-Racht, T. D.: "Pressure-Derivative Approach to Transient Test Analysis: A High-Permeability North Sea Reservoir Example," *JPT* (November 1985) 2023–39.
57. Cinco-Ley, H., Kuchuk, F., Ayoub, J., Samaniego, V. F. and Ayestaran, L.: "Analysis of Pressure Tests Through the use of Instantaneous Source Response Concepts," paper SPE 15476 presented at the 61st Annual Technical Conference and Exhibition of the Society of Petroleum Engineers, New Orleans, L, Oct. 5–8, 1986.
58. Denoso, J., "An Investigation Into Higher Order Derivative Applications", Schlumberger Internal Report
59. Bernstein, S. N., Collected works, Izd. Akad. Nauk SSSR, Moscow, 1952, 11–104, MR14-2.
60. Papoulis, A., *Signal Analysis*, McGraw-Hill International Editions, 1984.
61. Kou, B. C.,: Automatic control systems, John Wiley & Sons; 7 edition (Jan. 1, 1995).
62. Spencer, P. L., 2002: "A Variational Method For Improved Analyses of Scalars and Their Derivatives". Ph.D. Dissertation, The Pennsylvania State University, University Park, Pa., 121 pp. [Available from: UMI Dissertation Publishing, ProQuest Information and Learning, P. O. Box 1346, Ann Arbor, Mich. 48106-1346]. Presented at NATIONAL SEVERE STORMS LABORATORY SEMINAR SERIES, NOAA/NSSL and CIMMS, Friday Oct. 4, 2002.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:
1. A method responsive to an input signal representing a measurement and having noise for generating an output signal representing said measurement substantially devoid of said noise, said method comprising:
convolving said input signal, representing said measurement and having noise, with a wavelet having a determined set of coefficients; and
generating said output signal in response to the convolving step, said output signal being substantially devoid of the noise.

2. The method of claim 1, wherein said input signal is a particular function representing a pressure measurement in a wellbore, said pressure measurement including noise.

3. The method of claim 1, wherein said output signal is a derivative of said input signal, said output signal being substantially devoid of said noise.

4. method of claim 3, wherein the step of convolving said input signal with a wavelet includes convolving said input signal with said wavelet using the following equation:

$$p_{wf}(t) = \int_0^t q(\tau) p'_{wf}(t-\tau) d\tau.$$

5. The method of claim 4, wherein said wavelet is a derivative wavelet.

6. The method of claim 5, wherein said derivative wavelet is made from a unit sample response of a bandlimited, optimum linear phase Finite Impulse Response digital differentiator.

7. The method of claim 3, wherein the step of convolving said input signal with a wavelet includes convolving said input signal with said wavelet using the following equation:

$$L^{-1}\{f(s)g(s)\} = \int_0^t F(\tau) G(t-\tau) d\tau.$$

8. The method of claim 7, wherein said wavelet is a derivative wavelet.

9. The method of claim 8, wherein said derivative wavelet is made from a unit sample response of a bandlimited, optimum linear phase Finite Impulse Response digital differentiator.

10. The method of claim 1, further comprising:
further convolving said output signal with said wavelet; and
generating a further output signal in response to the further convolving step, said further output signal being substantially devoid of said noise.

11. The method of claim 10, wherein said output signal represents a first derivative of said input signal, said output signal being substantially devoid of said noise.

12. The method of claim 11, wherein said further output signal represents a second derivative of said input signal, said further output signal being substantially devoid of said noise.

13. The method of claim 12, wherein the step of convolving said input signal with a wavelet and the step of further convolving said output signal with said wavelet uses the following equation:

$$p_{wf}(t) = \int_0^t q(\tau) p'_{wf}(t-\tau) d\tau.$$

14. The method of claim 13, wherein said wavelet is made from a unit sample response of a bandlimited, optimum linear phase Finite Impulse Response digital differentiator.

15. The method of claim 12, wherein the step of convolving said input signal with a wavelet and the step of further convolving said output signal with said wavelet uses the following equation:

$$L^{-1}\{f(s)g(s)\} = \int_0^t F(\tau) G(t-\tau) d\tau.$$

16. The method of claim 15, wherein said wavelet is made from a unit sample response of a bandlimited, optimum linear phase Finite Impulse Response digital differentiator.

17. A program storage device readable by a machine, tangibly embodying a program of instructions executable by the machine, to perform method steps for generating an output signal representing a measurement which is substantially devoid of any noise in response to an input signal representing said measurement and which includes said noise, said method steps comprising:
  convolving said input signal, representing said measurement and including said noise, with a wavelet having a determined set of coefficients; and
  generating said output signal in response to the convolving step, said output signal being substantially devoid of the noise.

18. The program storage device of claim 17, wherein said input signal is a particular function representing a pressure measurement in a wellbore, said pressure measurement including noise.

19. The program storage device of claim 17, wherein said output signal is a derivative of said input signal, said output signal being substantially devoid of said noise.

20. The program storage device of claim 19, wherein the step of convolving said input signal with a wavelet uses the following equation:

$$p_{wf}(t) = \int_0^t q(\tau) p'_{wf}(t-\tau)\, d\tau.$$

21. The program storage device of claim 20, wherein said wavelet is a derivative wavelet.

22. The program storage device of claim 21, wherein said derivative wavelet is made from a unit sample response of a bandlimited, optimum linear phase Finite Impulse Response digital differentiator.

23. The program storage device of claim 19, wherein the step of convolving said input signal with a wavelet uses the following equation:

$$L^{-1}\{f(s)g(s)\} = \int_0^t F(\tau)G(t-\tau)\, d\tau.$$

24. The program storage device of claim 23, wherein said wavelet is a derivative wavelet.

25. The program storage device of claim 24, wherein said derivative wavelet is made from a unit sample response of a bandlimited, optimum linear phase Finite Impulse Response digital differentiator.

26. The program storage device of claim 17, further comprising:
  further convolving said output signal with said wavelet; and
  generating a further output signal in response to the further convolving step, said further output signal being substantially devoid of said noise.

27. The program storage device of claim 26, wherein said output signal represents a first derivative of said input signal, said output signal being substantially devoid of said noise.

28. The program storage device of claim 27, wherein said further output signal represents a second derivative of said input signal, said further output signal being substantially devoid of said noise.

29. The program storage device of claim 28, wherein the step of convolving said input signal with a wavelet and the step of further convolving said output signal with said wavelet each use the following equation:

$$p_{wf}(t) = \int_0^t q(\tau) p'_{wf}(t-\tau)\, d\tau.$$

30. The program storage device of claim 29, wherein said wavelet is made from a unit sample response of a bandlimited, optimum linear phase Finite Impulse Response digital differentiator.

31. The storage program device of claim 28, wherein the step of convolving said input signal with a wavelet and the step of further convolving said output signal with said wavelet each use the following equation:

$$L^{-1}\{f(s)g(s)\} = \int_0^t F(\tau)G(t-\tau)\, d\tau.$$

32. The program storage device of claim 31, wherein said wavelet is made from a unit sample response of a bandlimited, optimum linear phase Finite Impulse Response digital differentiator.

33. The method of claim 1, wherein said input signal is a particular function including a set of digital data samples representing a pressure measurement in a wellbore, said pressure measurement including noise.

34. The method of claim 33, wherein said output signal is a derivative of said particular function, said derivative of said particular function being substantially devoid of said noise.

35. The method of claim 34, wherein the step of convolving said digital input signal with a wavelet includes convolving said input signal with said wavelet using the following equation:

$$DPDT(t) = \sum_{m=0}^{N-1} h(m)\text{signal}(t-m).$$

36. The method of claim 35, wherein said wavelet is a derivative wavelet.

37. The method of claim 36, wherein said derivative wavelet is made from a band limited transform of an ideal differentiator, the band limited transform having a band limited cutoff frequency design value.

38. The method of claim 37, wherein the band limited cutoff frequency design value is selected as that value above which noise is a principal component of the total signal.

39. The method of claim 36, wherein one or more coefficients of the wavelet are computed using a Chebyshev method using a Remez exchange algorithm.

40. The program storage device of claim 17, wherein said input signal is a particular function including a set of digital data samples representing a pressure measurement in a wellbore, said pressure measurement including noise.

41. The program storage device of claim 40, wherein said output signal is a derivative of said particular function, said derivative of said particular function being substantially devoid of said noise.

42. The program storage device of claim 41, wherein the step of convolving said digital input signal with a wavelet includes convolving said input signal with said wavelet using the following equation:

$$DPDT(t) = \sum_{m=0}^{N-1} h(m)\text{signal}(t-m).$$

43. The program storage device of claim 42, wherein said wavelet is a derivative wavelet.

44. The program storage device of claim 43, wherein said derivative wavelet is made from a band limited transform of the ideal differentiator, said band limited transform having a band limited cutoff frequency design value.

45. The program storage device of claim 44, wherein the band limited cutoff frequency's design value is selected as that value above which noise is a principal component of the total signal.

46. The program storage device of claim 43, wherein one or more coefficients of the wavelet are computed using a Chebyshev method using a Remez exchange algorithm.

47. A method responsive to an input signal representing a measurement and having noise for generating an output signal representing said measurement substantially devoid of said noise, said method comprising:

convolving said input signal, representing said measurement and including said noise, with a wavelet having a determined set of coefficients; and generating said output signal in response to the convolving step, said output signal representing a derivative of said input signal, said output signal being substantially devoid of said noise.

48. A program storage device readable by a machine, tangibly embodying a program of instructions executable by the machine, to perform method steps which are responsive to an input signal representing a measurement and having noise for generating an output signal representing said measurement substantially devoid of said noise, said method steps comprising:

convolving said input signal, representing a measurement and including said noise, with a wavelet having a determined set of coefficients; and generating said output signal in response to the convolving step, said output signal representing a derivative of said input signal, said output signal being substantially devoid of said noise.

* * * * *